United States Patent
Lee et al.

(10) Patent No.: US 12,243,815 B2
(45) Date of Patent: Mar. 4, 2025

(54) SEMICONDUCTOR DEVICE AND METHOD OF FABRICATING THE SAME

(71) Applicant: Samsung Electronics Co., Ltd., Suwon-si (KR)

(72) Inventors: Eui Bok Lee, Seoul (KR); Wandon Kim, Seongnam-si (KR); Rakhwan Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 507 days.

(21) Appl. No.: 17/680,507

(22) Filed: Feb. 25, 2022

(65) Prior Publication Data

US 2023/0022545 A1    Jan. 26, 2023

(30) Foreign Application Priority Data

Jul. 26, 2021    (KR) .......................... 10-2021-0097640

(51) Int. Cl.
*H01L 23/522*  (2006.01)
*H01L 21/768*  (2006.01)
*H10D 64/23*   (2025.01)

(52) U.S. Cl.
CPC .... *H01L 23/5226* (2013.01); *H01L 21/76802* (2013.01); *H01L 21/76877* (2013.01); *H10D 64/256* (2025.01)

(58) Field of Classification Search
CPC ........... H01L 23/5226; H01L 21/76804; H01L 23/5283; H01L 21/76832; H01L 21/76897; H01L 21/7681; H01L 21/76877; H01L 21/76807; H01L 29/0649; H01L 23/528; H01L 21/76802; H01L 29/41766
See application file for complete search history.

(56) References Cited

U.S. PATENT DOCUMENTS

| | | | |
|---|---|---|---|
| 6,159,759 A | 12/2000 | Shao et al. | |
| 6,940,170 B2 | 9/2005 | Parikh | |
| 7,399,696 B2 | 7/2008 | Coolbaugh et al. | |
| 7,904,868 B2 | 3/2011 | Feilchenfeld et al. | |
| 8,350,386 B2 | 1/2013 | Lin et al. | |
| 9,159,620 B2 | 10/2015 | Mackh et al. | |
| 9,275,900 B2* | 3/2016 | Lu | H01L 21/76802 |
| 10,170,421 B2 | 1/2019 | Azmat et al. | |
| 11,270,992 B2* | 3/2022 | Kim | H01L 23/528 |
| 11,444,024 B2* | 9/2022 | Lin | H01L 23/5226 |

(Continued)

*Primary Examiner* — Christopher A Johnson
*Assistant Examiner* — Corbyn D Mellinger
(74) *Attorney, Agent, or Firm* — Muir Patent Law, PLLC

(57) ABSTRACT

A semiconductor device includes a front-end-of-line (FEOL) layer, which includes a plurality of individual devices, on a substrate, and first, second, and third metal layers sequentially stacked on the FEOL layer. The second metal layer includes an interlayer insulating layer and an interconnection line in the interlayer insulating layer. The interconnection line includes a lower via portion electrically connected to the first metal layer, an upper via portion electrically connected to the third metal layer, and a line portion between the lower via portion and the upper via portion. A line width of an upper portion of the interconnection line gradually decreases in a vertical direction away from the substrate, and a line width of a lower portion of the interconnection line gradually increases in a vertical direction away from the substrate.

20 Claims, 37 Drawing Sheets

(56) References Cited

U.S. PATENT DOCUMENTS

| | | | |
|---|---|---|---|
| 2014/0335689 A1* | 11/2014 | Lu | H01L 21/7684 |
| | | | 438/631 |
| 2020/0243377 A1 | 7/2020 | Liu | |
| 2020/0403032 A1 | 12/2020 | Dutta et al. | |
| 2021/0134784 A1* | 5/2021 | Kim | H01L 29/78696 |
| 2022/0139823 A1* | 5/2022 | Lin | H01L 21/76819 |
| | | | 257/774 |

* cited by examiner

SEMICONDUCTOR DEVICE AND METHOD OF FABRICATING THE SAME

CROSS-REFERENCE TO RELATED APPLICATION(S)

This U.S. non-provisional patent application claims priority under 35 U.S.C. § 119 to Korean Patent Application No. 10-2021-0097640, filed on Jul. 26, 2021, in the Korean Intellectual Property Office, the disclosure of which is hereby incorporated by reference in its entirety.

BACKGROUND OF THE INVENTION

The present disclosure relates to a semiconductor device and a method of fabricating the same, and in particular, to a semiconductor device including a field effect transistor and a method of fabricating the same.

A semiconductor device includes an integrated circuit consisting of metal-oxide-semiconductor field-effect transistors (MOSFETs). To meet an increasing demand for a semiconductor device with a small pattern size and a reduced design rule, the MOSFETs are being aggressively scaled down. The scale-down of the MOSFETs may lead to deterioration in operational properties of the semiconductor device. A variety of studies are being conducted to overcome technical limitations associated with the scale-down of the semiconductor device and to realize high-performance semiconductor devices.

SUMMARY

An embodiment of the inventive concept provides a semiconductor device with improved reliability and electrical characteristics and a method of fabricating the same.

According to an embodiment of the inventive concept, a semiconductor device may include a front-end-of-line (FEOL) layer, which includes a plurality of individual devices, on a substrate, and a first metal layer, a second metal layer, and a third metal layer sequentially stacked on the FEOL layer. The second metal layer may include an interlayer insulating layer and an interconnection line in the interlayer insulating layer, and the interconnection line may include a lower via portion electrically connected to the first metal layer, an upper via portion electrically connected to the third metal layer, and a line portion between the lower via portion and the upper via portion. The interlayer insulating layer may include a lower interlayer insulating layer and an upper interlayer insulating layer on the lower interlayer insulating layer. A lower portion of the interconnection line may be buried in the lower interlayer insulating layer, and an upper portion of the interconnection line may be buried in the upper interlayer insulating layer. A line width of the upper portion may gradually decrease in a vertical direction away from the substrate, and a line width of the lower portion may gradually increase in the vertical direction away from the substrate.

According to an embodiment of the inventive concept, a semiconductor device may include an FEOL layer, which includes a plurality of individual devices, on a substrate, and a first metal layer, a second metal layer, and a third metal layer sequentially stacked on the FEOL layer. The second metal layer may include a lower interlayer insulating layer, an upper interlayer insulating layer, and an interconnection line extending in a first direction. The interconnection line may include a lower portion and an upper portion, which are buried in the lower and upper interlayer insulating layers, respectively. The lower portion may include a lower via portion electrically connected to the first metal layer, and the upper portion may include an upper via portion electrically connected to the third metal layer. The lower and upper portions of the interconnection line may be offset from each other in a second direction crossing the first direction.

According to an embodiment of the inventive concept, a semiconductor device may include a substrate including an active region, a device isolation layer defining active patterns on the active region and covering a lower side surface of each of the active patterns, source/drain patterns provided in upper portions of the active patterns, a channel pattern interposed between each pair of source/drain patterns, a gate electrode extended in a first direction to cross the channel pattern, a gate spacer provided at both sides of the gate electrode and extended in the first direction, along with the gate electrode, a gate insulating layer interposed between the gate electrode and the channel pattern and between the gate electrode and the gate spacer, a gate capping pattern provided on a top surface of the gate electrode and extended in the first direction, along with the gate electrode, an active contact electrically connected to at least one of the source/drain patterns, a gate contact provided to penetrate the gate capping pattern and electrically connected to the gate electrode, and a first metal layer, a second metal layer, and a third metal layer sequentially stacked on the active contact and the gate contact. The first metal layer may be electrically connected to the active contact and the gate contact, and the second metal layer may include an interlayer insulating layer and an interconnection line in the interlayer insulating layer. The interconnection line may include a lower via portion electrically connected to the first metal layer, an upper via portion electrically connected to the third metal layer, and a line portion between the lower via portion and the upper via portion. One of a first side surface of the upper via portion and a second side surface of the lower via portion may have a positive slope, and the other of the first and second side surfaces may have a negative slope.

According to an embodiment of the inventive concept, a method of fabricating a semiconductor device may include forming an FEOL layer, which includes a plurality of individual devices, on a substrate and forming a metal layer on the FEOL layer. The forming of the metal layer may include forming a lower interlayer insulating layer on the FEOL layer, patterning the lower interlayer insulating layer to form an interconnection trench and a via hole below the interconnection trench, forming a conductive layer on the lower interlayer insulating layer to fill the interconnection trench and the via hole, forming a first mask pattern, which is aligned to the interconnection trench, on the conductive layer, forming an interconnection line by etching the conductive layer using the first mask pattern as an etch mask, forming a second mask pattern by removing a portion of the first mask pattern and leaving a remaining portion of the first mask pattern, and forming an upper via portion by recessing an upper portion of the interconnection line using the second mask pattern as an etch mask.

DETAILED DESCRIPTION

FIGS. 1 to 6 are perspective views illustrating a method of forming a metal layer according to according to example embodiments of the inventive concept.

Figure 1:
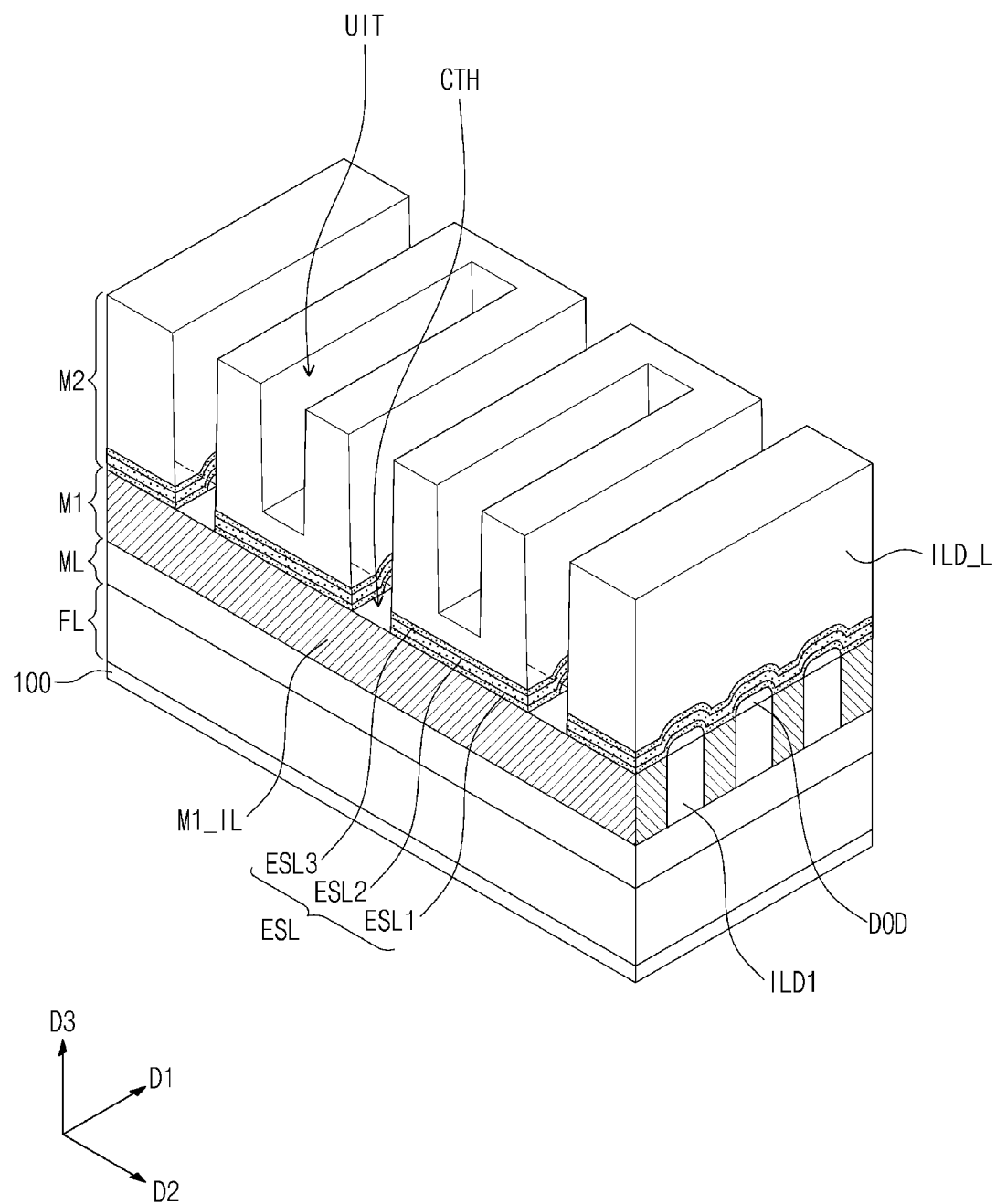
FIGS. 1 to 6 are perspective views illustrating a method of forming a metal layer according to example embodiments of the inventive concept.

Referring to FIG. 1, a front-end-of-line (FEOL) layer FL may be formed on a substrate 100. The substrate 100 may be a semiconductor substrate that is formed of or includes silicon, germanium, silicon-germanium, a compound semiconductor material, or the like. In an embodiment, the substrate 100 may be a silicon wafer. The substrate 100 may include a conductive region (e.g., an impurity-doped well or an impurity-doped structure). The substrate 100 may include a device isolation structure (e.g., a shallow trench isolation (STI) structure).

The FEOL layer FL may include a plurality of individual devices and an interlayer insulating layer covering them. The individual devices may include various microelectronic devices (e.g., metal-oxide-semiconductor field effect transistors (MOSFETs), system large-scale integration (LSI), an image sensor such as a CMOS imaging sensor (CIS), micro-electro-mechanical system (MEMS) devices, active devices, and passive devices). Each of the individual devices may be electrically connected to a conductive region of the substrate 100. The individual devices may be electrically disconnected from each other by the interlayer insulating layer and/or the device isolation structure.

A middle-of-line (MOL) layer ML may be formed on the FEOL layer FL. The MOL layer ML may include contacts, which are electrically connected to the individual devices (e.g., transistors) formed on the substrate 100. The MOL layer ML may be used to electrically connect the FEOL layer FL to a back-end-of-line (BEOL) layer M1 or M2, which will be described below.

The BEOL layer M1 or M2 may be formed on the MOL layer ML. The BEOL layer may include a plurality of stacked metal layers. Interconnection lines in the metal layers of the BEOL layer may be used to connect the individual devices of the FEOL layer FL to each other. The interconnection lines of the metal layers of the BEOL layer may be configured to input or output signals to or from the individual devices of the FEOL layer FL.

In detail, the lowermost metal layer of the BEOL layer (hereinafter, a first metal layer M1) may be formed on the MOL layer ML. The formation of the first metal layer M1 may include forming a plurality of M1 interconnection lines M1_IL, which are electrically connected to the MOL layer ML, and forming a first interlayer insulating layer ILD1 to fill spaces between the M1 interconnection lines M1_IL. In an embodiment, the M1 interconnection lines M1_IL may be formed using at least one of a single damascene process, a dual damascene process, and a metal etching process. For example, each of the M1 interconnection lines M1_IL may be a line-shaped pattern extending in a second direction D2.

A second metal layer M2 may be formed on the first metal layer M1. Hereinafter, a method of forming the second metal layer M2 according to an embodiment of the inventive concept will be described in more detail below. A dielectric layer DOD may be selectively formed on a top surface of the first interlayer insulating layer ILD1 of the first metal layer M1. The dielectric layer DOD may not be formed on top surfaces of the M1 interconnection lines M1_IL.

In detail, the formation of the dielectric layer DOD may include selectively providing an inhibitor on the top surfaces of the M1 interconnection lines M1_IL and depositing the dielectric layer DOD on the first interlayer insulating layer ILD1. The inhibitor may prevent a precursor of the dielectric layer DOD from being attached to the top surfaces of the M1 interconnection lines M1_IL.

The dielectric layer DOD may contain elements X and Y. The element X may be an element selected from the group consisting of Si, Ge, Al, Zr, Y, Hf, and Mo, and the element Y may be O or N. The dielectric layer DOD may further contain carbon (C).

An etch stop layer ESL may be formed on the dielectric layer DOD and the M1 interconnection lines M1_IL. The formation of the etch stop layer ESL may include sequentially forming first, second, and third etch stop layers ESL1, ESL2, and ESL3.

First, the first etch stop layer ESL1 may be formed. The first etch stop layer ESL1 may cover the top surface of the dielectric layer DOD and the top surfaces of the M1 interconnection lines M1_IL. The first etch stop layer ESL1 may be formed to a thickness of 2 nm to 5 nm. The first etch stop layer ESL1 may be formed of a material having a high dielectric constant and a low density. The first etch stop layer ESL1 may be a metal oxide layer which contains at least one metallic element selected from the group consisting of Al, Zr, Y, Hf, and Mo. The first etch stop layer ESL1 may have an etch selectivity with respect to the dielectric layer DOD.

The second etch stop layer ESL2 may be formed on the first etch stop layer ESL1. The second etch stop layer ESL2 may be formed to a thickness of 3 nm to 10 nm. The thickness of the second etch stop layer ESL2 may be greater than the thickness of the first etch stop layer ESL1. The second etch stop layer ESL2 may be formed of a material having a low dielectric constant and a high density. The second etch stop layer ESL2 may contain elements X and Y and carbon (C). Here, the element X is an element selected from the group consisting of Si, Ge, Al, Zr, Y, Hf, and Mo, and the element Y may be O or N.

The third etch stop layer ESL3 may be formed on the second etch stop layer ESL2. The third etch stop layer ESL3 may be formed to a thickness of 2 nm to 5 nm. The thickness of the third etch stop layer ESL3 may be greater than the thickness of the first etch stop layer ESL1. The third etch stop layer ESL3 may be a metal oxide layer which contains at least one metallic element selected from the group consisting of Al, Zr, Y, Hf, and Mo. For example, the third etch stop layer ESL3 may be formed of or include the same material as the first etch stop layer ESL1.

A lower interlayer insulating layer ILD_L may be formed on the third etch stop layer ESL3. For example, the lower interlayer insulating layer ILD_L may include a silicon oxide layer containing silicon (Si) and oxygen (O). The lower interlayer insulating layer ILD_L may further contain carbon (C) and hydrogen (H).

An interconnection trench UIT may be formed by patterning an upper portion of the lower interlayer insulating layer ILD_L. Although not shown, the interconnection trench UIT may be formed by etching a portion of the lower interlayer insulating layer ILD_L using a plurality of first mask patterns as an etch mask. The interconnection trench UIT may have a bottom surface that is higher than a top surface of the etch stop layer ESL. A via hole CTH, which is extended from the bottom of the interconnection trench UIT, may be formed to penetrate the etch stop layer ESL and to expose a top surface of a M1 interconnection line M1_IL. Herein, for convenience of description, the terms of the M1 interconnection lines M1_IL and the M1 interconnection line M1_IL may be used interchangeably. Although not shown, the via hole CTH may be formed by sequentially etching the lower interlayer insulating layer ILD_L and the etch stop layer ESL disposed below the bottom of the interconnection trench UIT using a plurality of second mask patterns as an etch mask.

Since the dielectric layer DOD between the M1 interconnection lines M1_IL has an etch selectivity with respect to the etch stop layer ESL, the dielectric layer DOD may be unetched when the etch stop layer ESL is etched to form the via hole CTH. Due to this property of the dielectric layer DOD, the via hole CTH may be formed to expose only the top surface of the M1 interconnection line M1_IL in a self-aligned manner.

Figure 2:
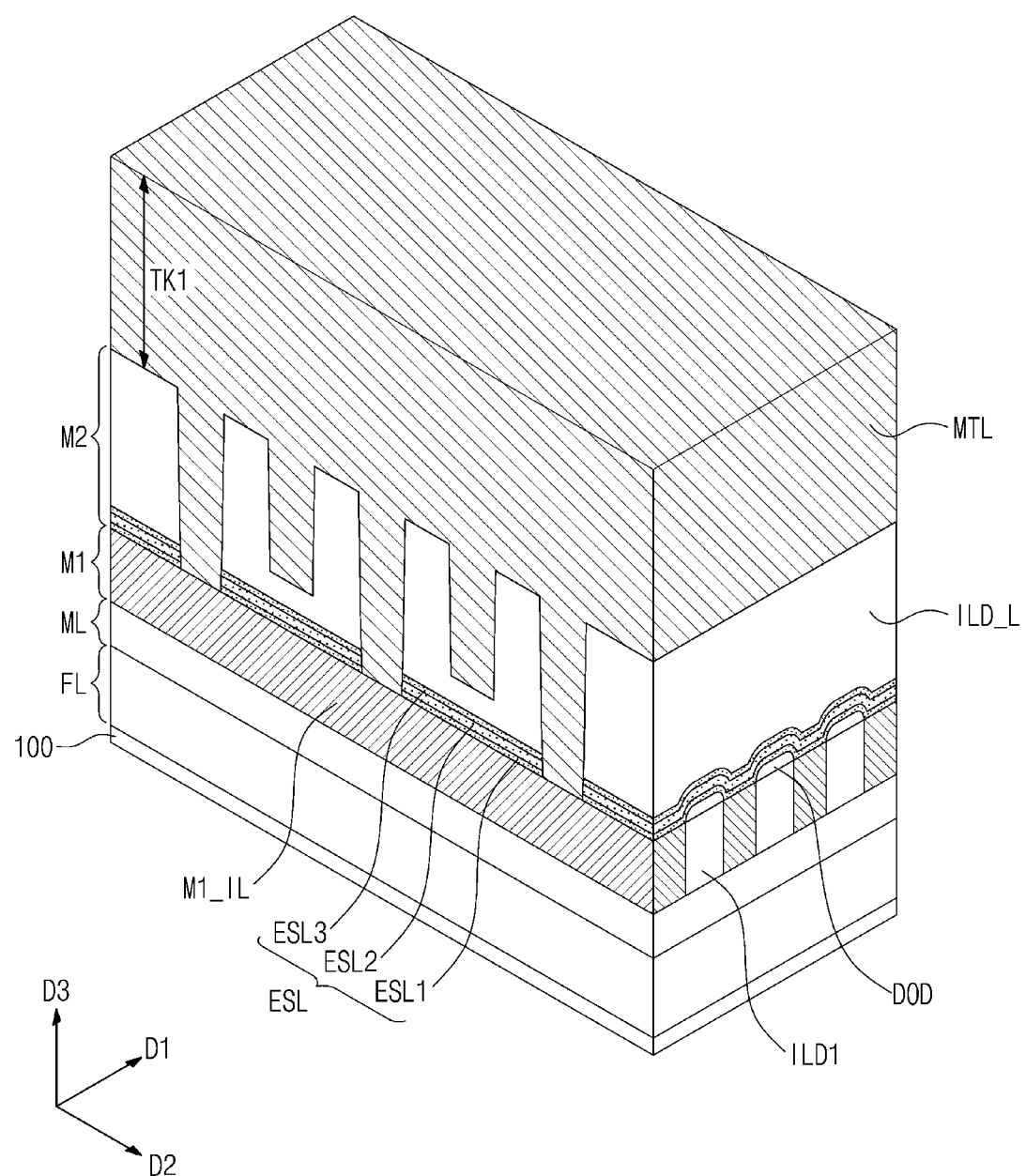

Referring to FIG. 2, a conductive layer MTL may be formed on the entire top surface of the substrate 100 to fill the interconnection trench UIT and the via hole CTH. The conductive layer MTL may be formed not only to fill the interconnection trench UIT and the via hole CTH but also to have a sufficiently large thickness on the lower interlayer insulating layer ILD_L. The conductive layer MTL on the lower interlayer insulating layer ILD_L may have a first thickness TK1.

In an embodiment, the conductive layer MTL may be formed of or include a metallic material, which can be directly formed on the lower interlayer insulating layer ILD_L without a barrier metal. The conductive layer MTL may be formed of or include a metallic material which can be patterned by an etching process. For example, the conductive layer MTL may be formed of or include a metallic material (e.g., molybdenum (Mo), ruthenium (Ru), tungsten (W), cobalt (Co), or binary metals provided as combinations of them).

Figure 3:
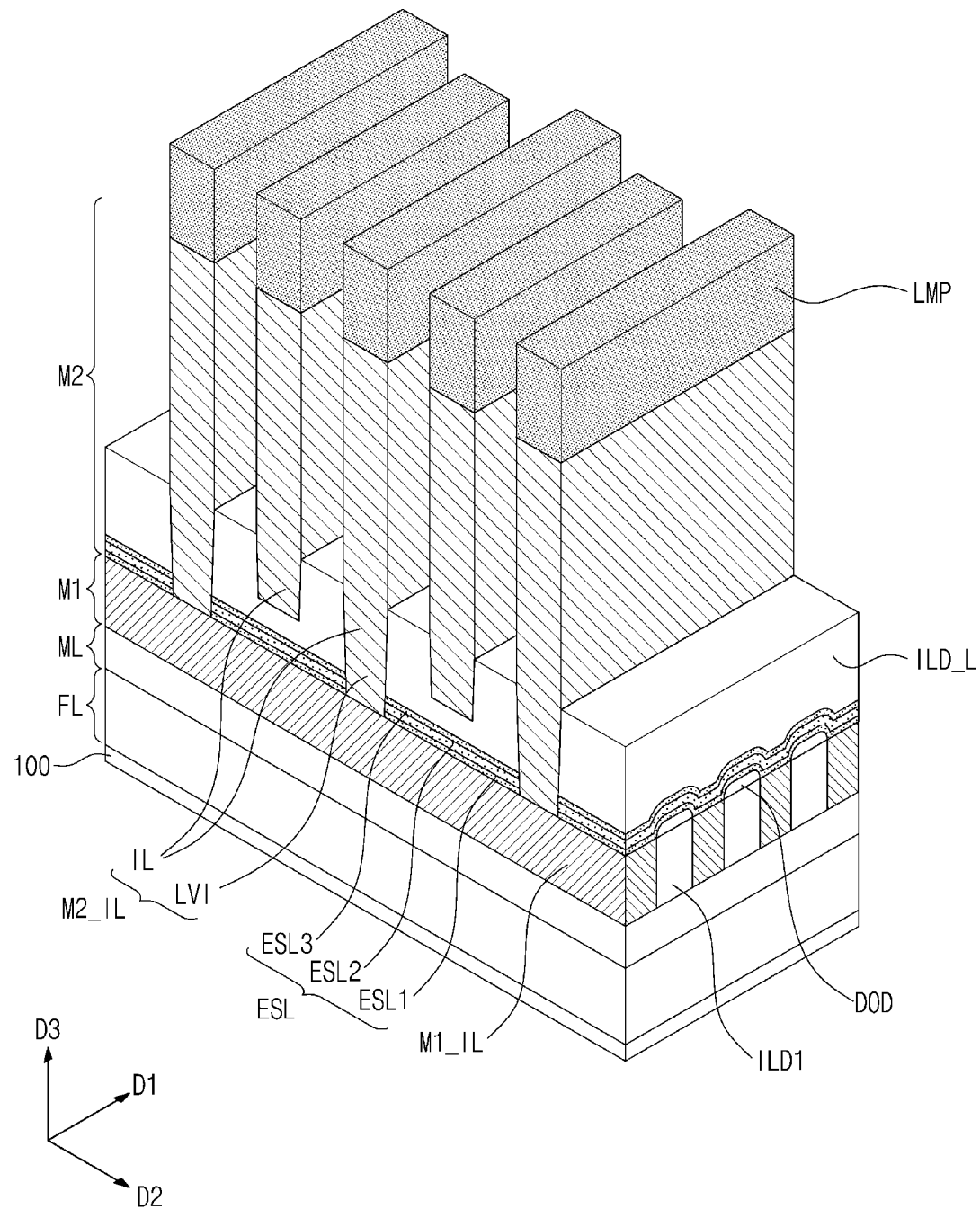

Referring to FIG. 3, a plurality of third mask patterns LMP may be formed on the conductive layer MTL. Each of the third mask patterns LMP may be a line-shaped pattern extending in a first direction D1. The third mask patterns LMP may be respectively used to define a plurality of M2 interconnection lines M2_IL, which will be formed in a subsequent step. In an embodiment, the third mask patterns LMP may be formed to be vertically overlapped with the interconnection trenches UIT, respectively.

The M2 interconnection lines M2_IL may be formed by etching the conductive layer MTL using the third mask patterns LMP as an etch mask. Each of the M2 interconnection lines M2_IL may be a line-shaped pattern extending in the first direction D1. A lower portion of each of the M2 interconnection lines M2_IL may be buried in the lower interlayer insulating layer ILD_L, and an upper portion of each of the M2 interconnection lines M2_IL may protrude above the lower interlayer insulating layer ILD_L and may be exposed to the outside.

The M2 interconnection line M2_IL may include a lower via portion LVI filling the via hole CTH and a line portion IL, which is provided on the lower via portion LVI and has a line shape. Herein, for convenience of description, the terms of the M2 interconnection lines M2_IL and the M2 interconnection line M2_IL may be used interchangeably. The lower via portion LVI may be in contact with the M1 interconnection line M1_IL and may be electrically connected to the M1 interconnection line M1_IL. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact. A bottom surface of the line portion IL may correspond to the bottom surface of the interconnection trench UIT and may be higher than the top surface of the etch stop layer ESL. For example, the lower via portion LVI may contact the line portion IL at a level at which the bottom of the interconnection trench UIT is located.

Figure 4:
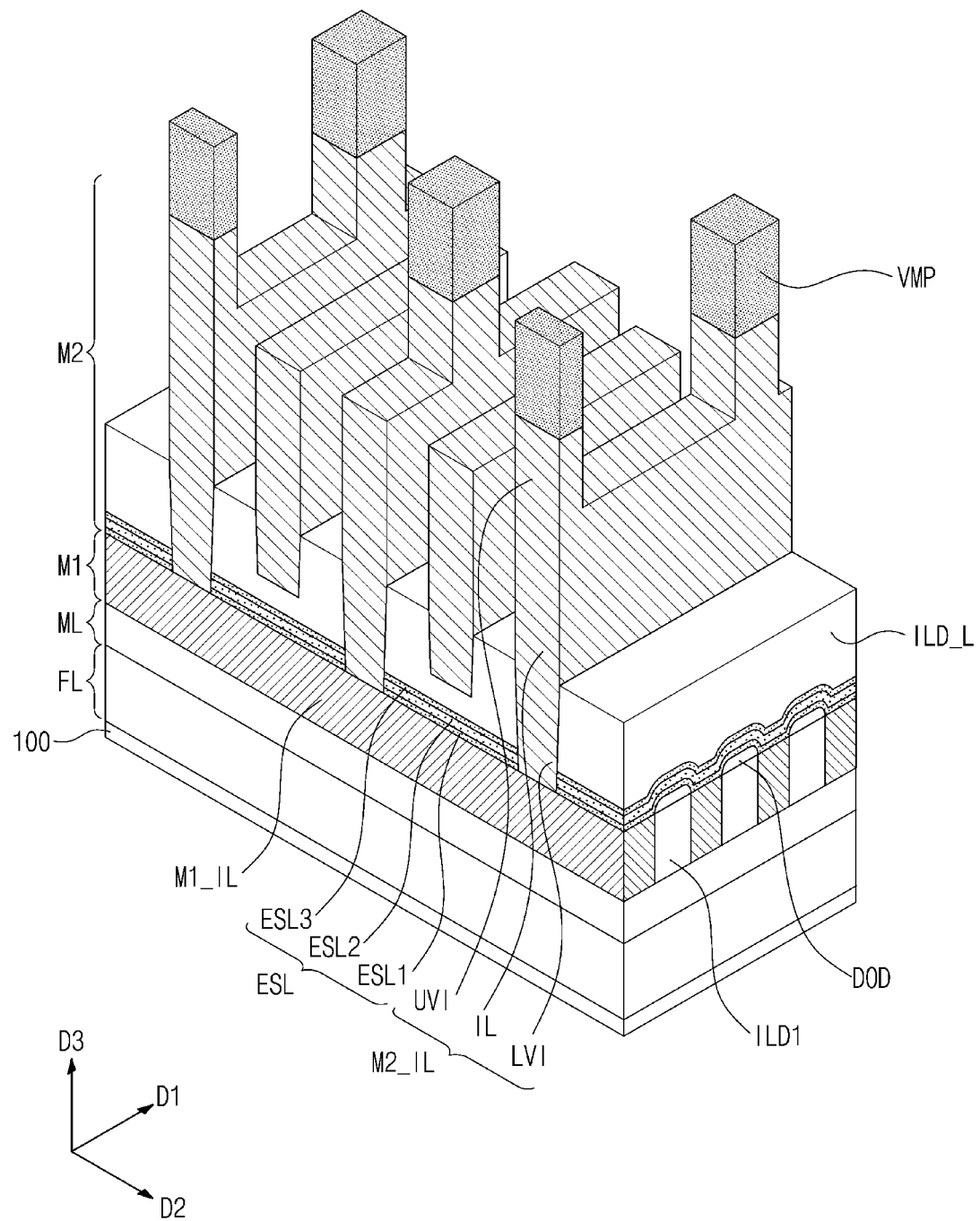

Referring to FIG. 4, a process of leaving a portion of the third mask pattern LMP and removing the remaining portion may be performed to form at least one fourth mask pattern VMP from the third mask patterns LMP. Herein, for convenience of description, the terms of the third mask pattern LMP and the third mask patterns LMP may be used interchangeably. In an embodiment, a plurality of fourth mask patterns VMP may be formed to define a plurality of upper via portions UVI in a subsequent step.

The upper via portions UVI may be formed by etching an upper portion of the M2 interconnection lines M2_IL using the fourth mask patterns VMP as an etch mask. In detail, a portion of the M2 interconnection line M2_IL, which is covered with the fourth mask patterns VMP, may be left as it is, and a remaining portion, which is not covered with the fourth mask patterns VMP, may be recessed. As a result, the M2 interconnection line M2_IL may include an upper via portion UVI on the line portion IL, in addition to the lower via portion LVI and the line portion IL. Herein, for convenience of description, the terms of the upper via portion UVI and the upper via portions UVI may be used interchangeably.

The lower via portion LVI may be used as a V1 via plug, which electrically connects the M1 interconnection line M1_IL to the M2 interconnection line M2_IL, and the upper via portion UVI may be used as a V2 via plug, which electrically connects the M2 interconnection line M2_IL to an M3 interconnection line thereon. In the present embodiment, it may be possible to form all of three sequentially-stacked structures (e.g., V1, M2, and V2) from the single conductive layer MTL.

Figure 5:
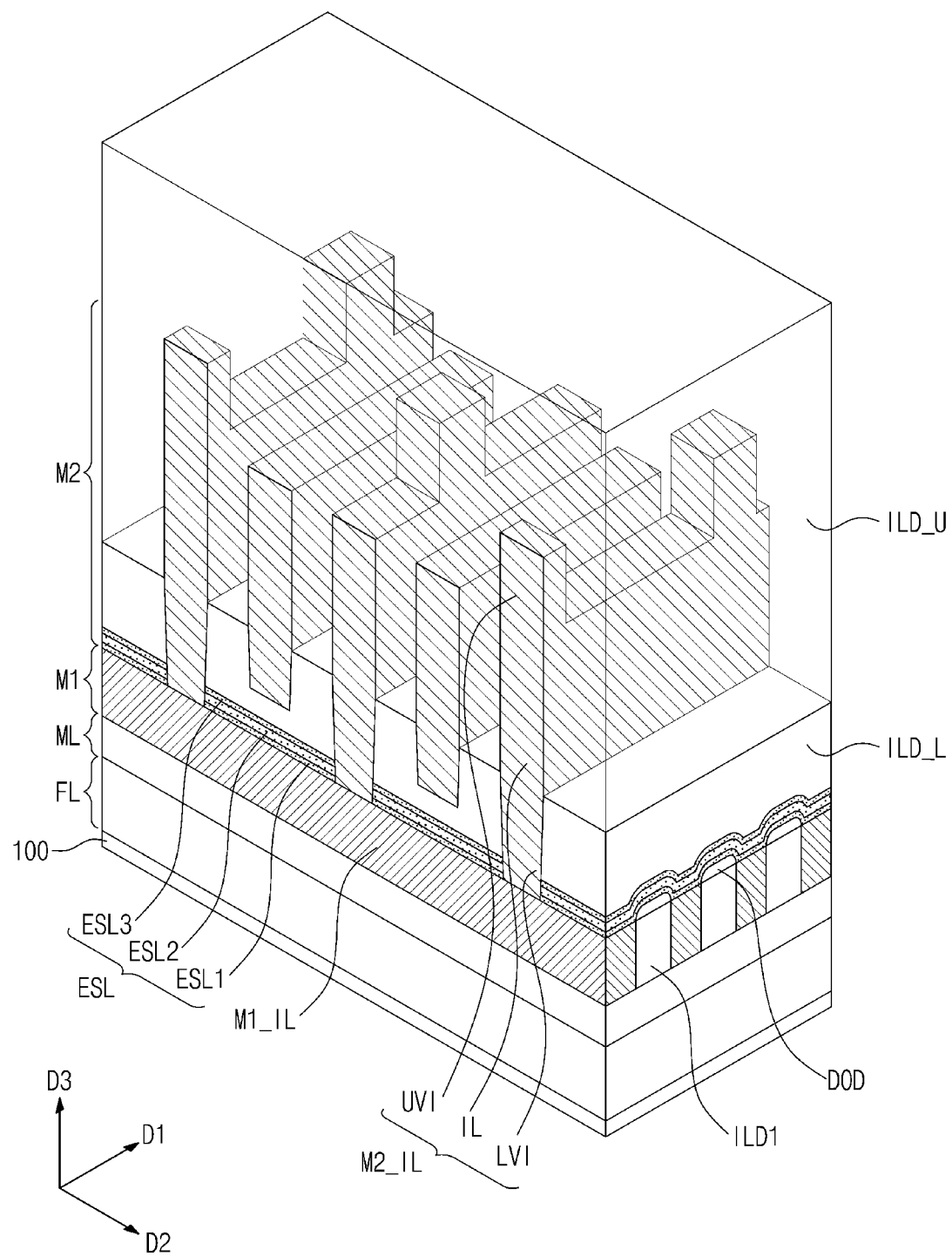

Referring to FIG. 5, an upper interlayer insulating layer ILD_U may be formed on the lower interlayer insulating layer ILD_L to cover the M2 interconnection lines M2_IL. When the upper interlayer insulating layer ILD_U is deposited on the M2 interconnection lines M2_IL, an air gap may be formed between the M2 interconnection lines M2_IL, which are adjacent to each other, as shown in FIG. 7A.

Figure 6:
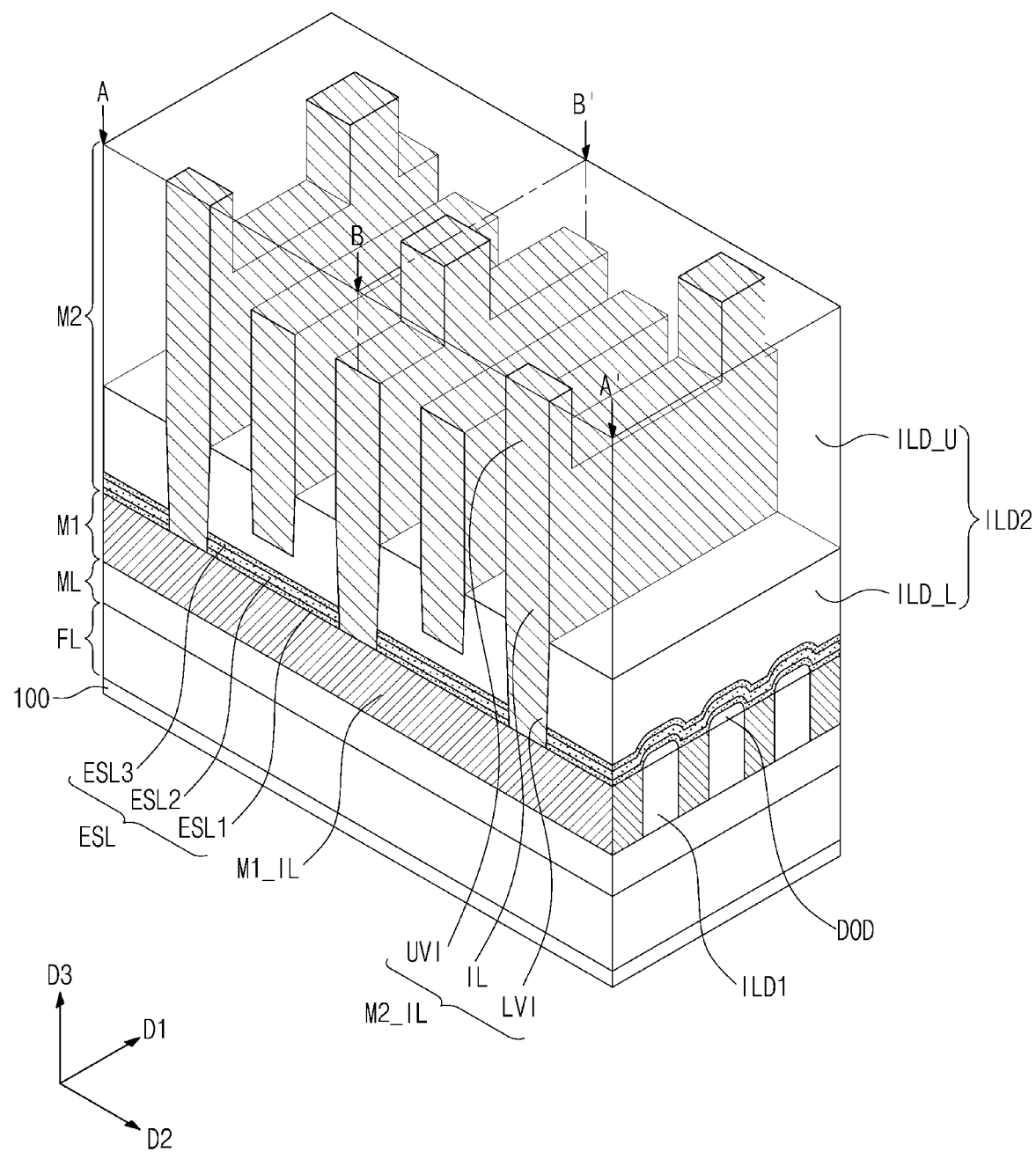

Referring to FIG. 6, a planarization process on the upper interlayer insulating layer ILD_U may be performed to expose the top surfaces of the M2 interconnection lines M2_IL. For example, the planarization process may be performed until a top surface of the upper via portion UVI of the M2 interconnection line M2_IL is exposed to the outside. The planarized upper interlayer insulating layer ILD_U and the lower interlayer insulating layer ILD_L thereunder may constitute a second interlayer insulating layer ILD2 of the second metal layer M2.

Figure 7A:
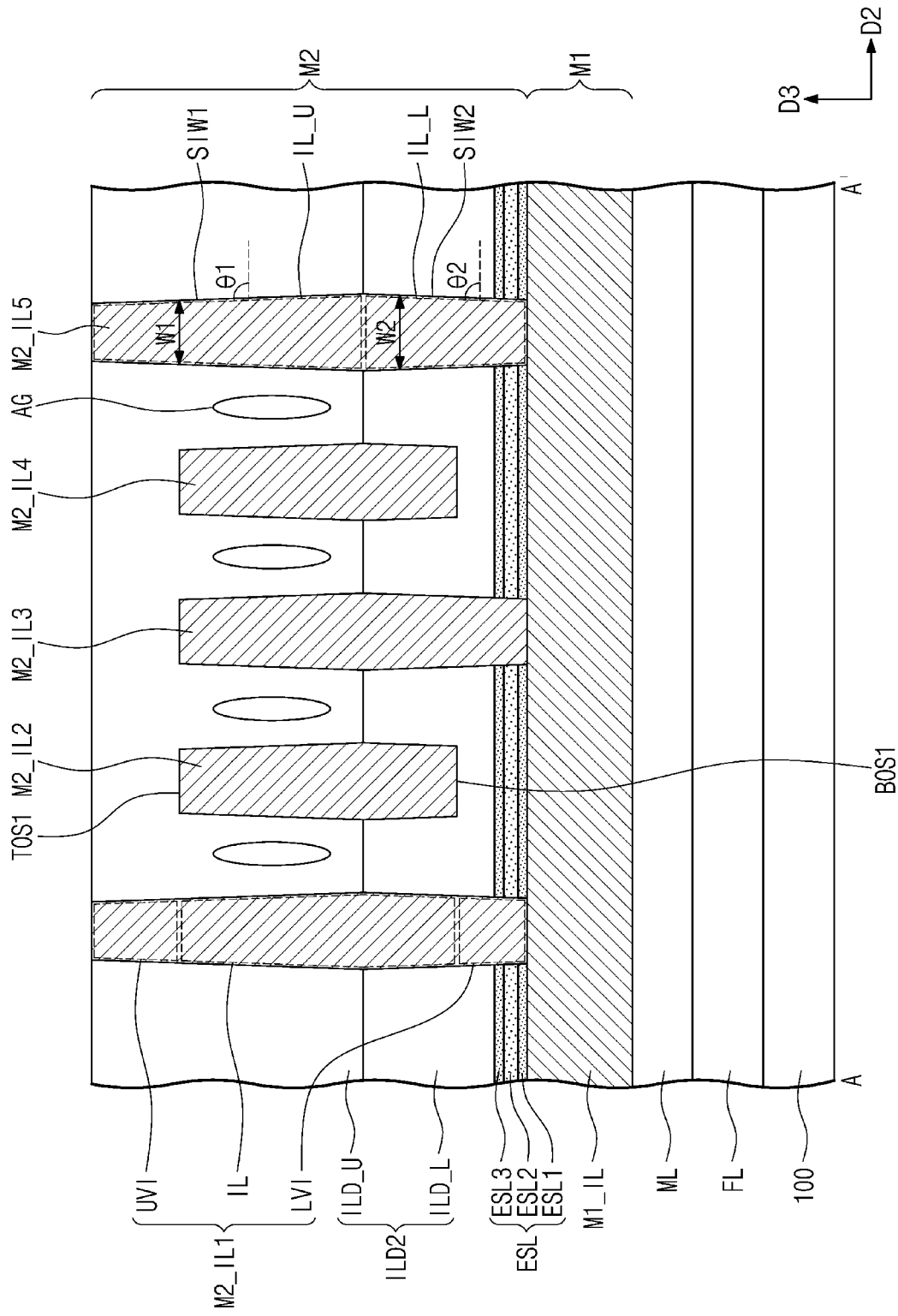
FIGS. 7A and 7B are sectional views, which are respectively taken along lines A-A' and B-B' of FIG. 6 to illustrate a semiconductor device according to an embodiment of the inventive concept.
Figure 7B:
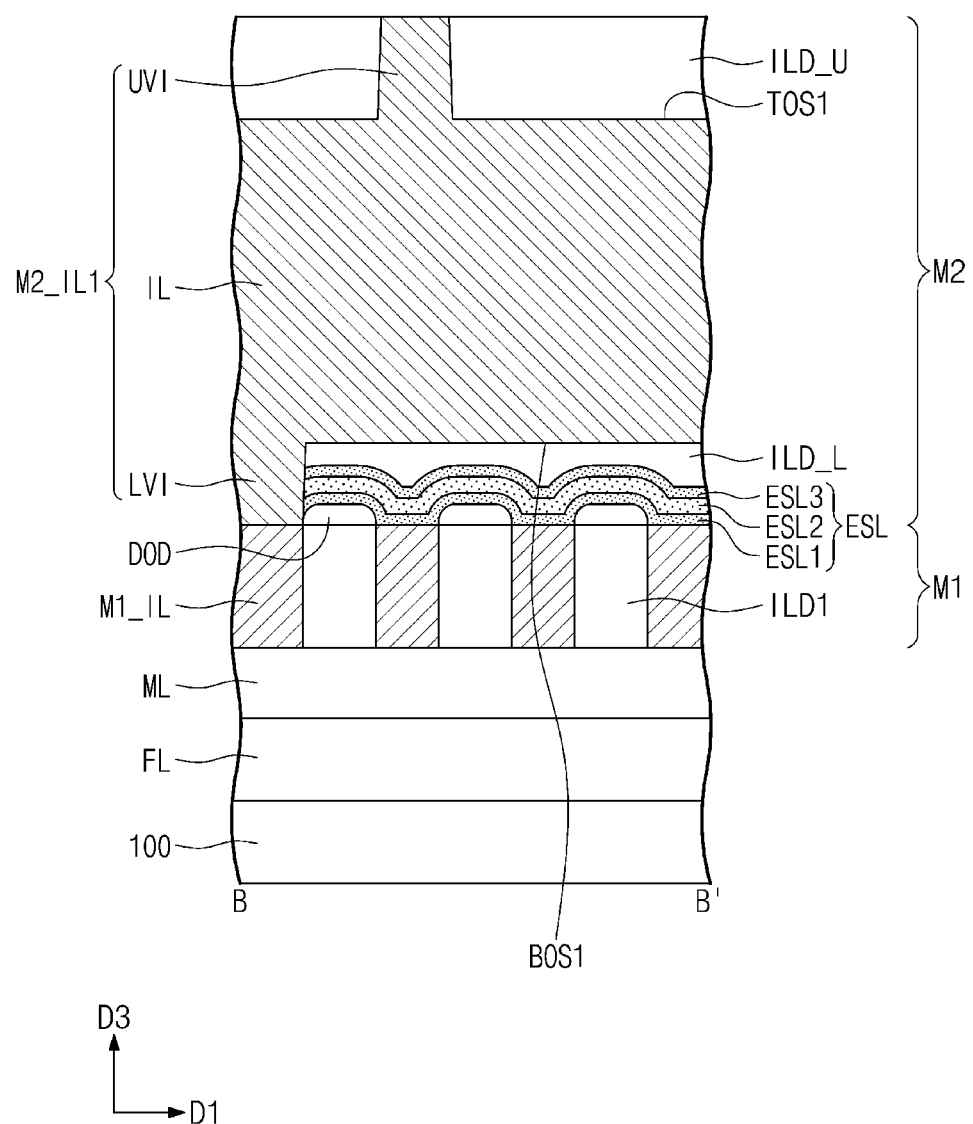

FIGS. 7A and 7B are sectional views, which are respectively taken along lines A-A' and B-B' of FIG. 6 to illustrate a semiconductor device according to an embodiment of the inventive concept.

Referring to FIGS. 6, 7A, and 7B, the FEOL layer FL and the MOL layer ML may be sequentially stacked on the substrate 100. The FEOL layer FL and the MOL layer ML will be described in more detail below.

The first metal layer M1, which is the lowermost metal layer of the BEOL layer, may be provided on the MOL layer ML. The first metal layer M1 may include the M1 interconnection lines M1_IL, which are extended in the second direction D2 and are parallel to each other, and the first interlayer insulating layer ILD1, which is interposed between the M1 interconnection lines M1_IL and extended in the second direction D2.

Each of the M1 interconnection lines M1_IL may be formed of or include at least one of copper (Cu), aluminum (Al), ruthenium (Ru), cobalt (Co), tungsten (W), molybdenum (Mo), aluminum binary alloys (e.g., Al3Sc, Nb3Al, and AlRu), molybdenum binary alloys (e.g., MoTa and Co3Mo), ruthenium binary alloys, nickel binary alloys, MAX, and combinations thereof. The MAX may be metal phase compounds represented by the formula $M_{n+1}AX_n$, where n is 1, 2, or 3, M is a transition metal, A is an element in a group 13 or 14, and X is C and/or N. As an example, the MAX may be $V_2SiN$, $V_2AlC$, or $Cr_2AlC$.

In an embodiment, each of the M1 interconnection lines M1_IL may further include a barrier layer. The barrier layer may be formed of or include at least one of tantalum nitride (TaN), titanium nitride (TiN), tantalum oxide (TaO), titanium oxide (TiO), manganese nitride (MnN), and manganese oxide (MnO).

The second metal layer M2 may be provided on the first metal layer M1. The second metal layer M2 may include the dielectric layer DOD, the etch stop layer ESL, and the second interlayer insulating layer ILD2, which are sequentially stacked. The second metal layer M2 may further include the M2 interconnection lines M2_IL in the second interlayer insulating layer ILD2.

The dielectric layer DOD and the etch stop layer ESL may be interposed between the first interlayer insulating layer ILD1 and the second interlayer insulating layer ILD2.

The dielectric layer DOD may be in contact with the top surface of the first interlayer insulating layer ILD1. The dielectric layer DOD may be selectively provided on only the top surface of the first interlayer insulating layer ILD1, but not on the M1 interconnection lines M1_IL of the first metal layer M1. This may be because the dielectric layer DOD is selectively formed on the top surface of the first interlayer insulating layer ILD1 but not on the M1 interconnection lines M1_IL. A top surface of each of the M1 interconnection lines M1_IL may be lower than the top surface of the dielectric layer DOD.

The dielectric layer DOD may contain elements X and Y. Here, the element X is an element selected from the group consisting of Si, Ge, Al, Zr, Y, Hf, and Mo, and the element Y may be O or N. The dielectric layer DOD may further contain carbon (C). In an embodiment, the dielectric layer DOD may be formed of or include substantially the same material as the first interlayer insulating layer ILD1. In an embodiment, the dielectric layer DOD may be formed of or include SiOC.

The etch stop layer ESL may include the first etch stop layer ESL1, the second etch stop layer ESL2, and the third etch stop layer ESL3, which are sequentially stacked. The first etch stop layer ESL1 may directly cover the top surfaces of the M1 interconnection lines M1_IL and the dielectric layer DOD. The second etch stop layer ESL2 may cover a top surface of the first etch stop layer ESL1. The third etch stop layer ESL3 may cover a top surface of the second etch stop layer ESL2.

The first etch stop layer ESL1 may be a layer having a high dielectric constant and a low density. The first etch stop layer ESL1 may be a metal oxide layer or a metal nitride layer, which contains at least one metallic element selected from the group consisting of Al, Zr, Y, Hf, and Mo. For example, the first etch stop layer ESL1 may be formed of or include at least one of aluminum oxide, hafnium oxide, hafnium zirconium oxide, aluminum nitride, hafnium nitride, and hafnium zirconium nitride.

The second etch stop layer ESL2 may be a layer having a low dielectric constant and a high density. A dielectric constant of the second etch stop layer ESL2 may be lower than a dielectric constant of the first etch stop layer ESL1. A density of the second etch stop layer ESL2 may be greater than a density of the first etch stop layer ESL1.

The second etch stop layer ESL2 may contain elements X and Y and carbon (C). Here, the element X is an element selected from the group consisting of Si, Ge, Al, Zr, Y, Hf, and Mo, and the element Y may be O or N. For example, the second etch stop layer ESL2 may be formed of or include SiOC, SiNC, GeOC, or GeNC.

A content of carbon (C) in the second etch stop layer ESL2 may range from 10 at % (atomic percentage) to 25 at %. For example, the content of carbon (C) in the second etch stop layer ESL2 may range from 15 at % to 20 at %. A content of the element X in the second etch stop layer ESL2 may range from 30 at % to 50 at %.

The third etch stop layer ESL3 may be a metal oxide layer which contains at least one metallic element selected from the group consisting of Al, Zr, Y, Hf, and Mo. For example, the third etch stop layer ESL3 may be formed of or include aluminum oxide. In an embodiment, the third etch stop layer ESL3 may be formed of or include the same material as the first etch stop layer ESL1. In another embodiment, the third etch stop layer ESL3 may be formed of or include a material different from the first etch stop layer ESL1. A dielectric constant of the third etch stop layer ESL3 may be higher than the dielectric constant of the second etch stop layer ESL2. A density of the third etch stop layer ESL3 may be lower than the density of the second etch stop layer ESL2.

A thickness of the second etch stop layer ESL2 may be greater than a thickness of each of the first and third etch stop layers ESL1 and ESL3. For example, the thickness of each of the first and third etch stop layers ESL1 and ESL3 may range from 2 nm to 5 nm. The thickness of the second etch stop layer ESL2 may range from 3 nm to 10 nm.

The M2 interconnection lines M2_IL may include first to fifth M2 interconnection lines M2_IL1 to M2_IL5, which are disposed in the second direction D2. The first to fifth M2 interconnection lines M2_IL1 to M2_IL5 may be arranged at a constant pitch in the second direction D2.

Each of the first and fifth M2 interconnection lines M2_IL1 and M2_IL5 may include the lower via portion LVI, the line portion IL, and the upper via portion UVI. Each of the second to fourth M2 interconnection lines M2_IL2 to M2_IL4 may include the line portion IL. The lower via portion LVI may be provided to penetrate the first to third etch stop layers ESL1 to ESL3 and to be in contact with the top surface of the M1 interconnection line M1_IL.

According to an embodiment of the inventive concept, the etch stop layer ESL may serve as a triple etch stop layer composed of the first to third etch stop layers ESL1, ESL2, and ESL3. By using the triple etch stop layer ESL according to the present embodiment, it may be possible to realize a very high etch selectivity. Thus, the lower via portion LVI of the M2 interconnection line M2_IL may be in stable contact with the M1 interconnection line M1_IL without any process defect.

The dielectric layer DOD may be adjacent to the lower via portion LVI. Due to the presence of the dielectric layer DOD, the lower via portion LVI may be guided to be in contact with the M1 interconnection line M1_IL accurately. A section of the dielectric layer DOD in the first direction D1 may have a dome shape.

The line portion IL may have a line shape extending in the first direction D1. A bottom surface BOS1 of the line portion IL may be higher than the top surface of the etch stop layer ESL. The lower interlayer insulating layer ILD_L may be interposed between the bottom surface BOS1 of the line portion IL and the top surface of the etch stop layer ESL.

A top surface TOS1 of the line portion IL may be lower than a top surface of the second interlayer insulating layer ILD2. The top surface TOS1 of the line portion IL may be higher than a top surface of the lower interlayer insulating layer ILD_L and may be lower than a top surface of the upper interlayer insulating layer ILD_U.

The upper via portion UVI may be extended from the top surface TOS1 of the line portion IL in a vertical direction (e.g., a third direction D3). A top surface of the upper via portion UVI may be coplanar with the top surface of the second interlayer insulating layer ILD2. For example, the top surface of the upper via portion UVI may be exposed to the outside of the second interlayer insulating layer ILD2. The upper via portion UVI may be connected to an M3 interconnection line of a third metal layer provided on the second metal layer M2.

In the present embodiment, the lower via portion LVI, the line portion IL, and the upper via portion UVI of the M2 interconnection line M2_IL may be formed of or include the same metallic material and may constitute a single object. For example, there may be no observable interface between the lower via portion LVI, the line portion IL, and the upper via portion UVI. The M2 interconnection line M2_IL may be formed of or include a metallic material (e.g., molybdenum (Mo), ruthenium (Ru), tungsten (W), cobalt (Co), or binary metals provided as combinations of them).

The second interlayer insulating layer ILD2 may include the lower and upper interlayer insulating layers ILD_L and ILD_U, which are sequentially stacked. The lower and upper interlayer insulating layers ILD_L and ILD_U may be formed of or include the same insulating material or may be formed of or include different insulating materials. Even when the lower and upper interlayer insulating layers ILD_L and ILD_U include the same insulating material, they may differ from each other in a concentration of a specific element (e.g., carbon) contained therein. In this case, there may be an observable boundary or interface between the lower and upper interlayer insulating layers ILD_L and ILD_U.

The M2 interconnection line M2_IL may include a lower portion IL_L, which is buried in the lower interlayer insulating layer ILD_L, and an upper portion IL_U, which is buried in the upper interlayer insulating layer ILD_U. As previously described with reference to FIGS. 1 to 6, the lower portion IL_L in the lower interlayer insulating layer ILD_L may be a portion formed by a damascene process, and the upper portion IL_U in the upper interlayer insulating layer ILD_U may be a portion formed by an etching process. Since the lower and upper portions IL_L and IL_U are formed by processes different from each other, there may be a difference in structure between them.

In an embodiment, the upper via portion UVI and a portion of the line portion IL may be included in the upper portion IL_U of the M2 interconnection line M2_IL, and the lower via portion LVI and the other portion of the line portion IL may be included in the lower portion IL_L of the M2 interconnection line M2_IL.

In an embodiment, the upper portion IL_U of the M2 interconnection line M2_IL may include a first side surface SIW1, and the lower portion IL_L may include a second side surface SIW2. One of the first and second side surfaces SIW1 and SIW2 may have a positive slope, and the other may have a negative slope. For example, the first side surface SIW1 of the upper portion IL_U and the second side surface SIW2 of the lower portion IL_L may have profiles that are opposite to each other.

For example, an angle $\theta 1$ of the first side surface SIW1 relative to the top surface of the substrate 100 may be an obtuse angle that is greater than 90°. An angle $\theta 2$ of the second side surface SIW2 relative to the top surface of the substrate 100 may be an acute angle that is smaller than 90°.

Since the upper portion IL_U is formed by an etching process using a mask pattern, a line width W1 of the upper portion IL_U may gradually decrease in a direction away from the substrate 100 (i.e., in the third direction D3). Since the lower portion IL_L is formed by a damascene process performed to fill a trench, a line width W2 of the lower portion IL_L may gradually increase in the direction away from the substrate 100 (i.e., in the third direction D3).

A lower portion of the line portion IL of the M2 interconnection line M2_IL may be buried in the lower interlayer insulating layer ILD_L, and an upper portion of the line portion IL may be buried in the upper interlayer insulating layer ILD_U. Like the first and second side surfaces SIW1 and SIW2 described above, the upper and lower portions of the line portion IL may have sidewall profiles that are opposite to each other.

The upper interlayer insulating layer ILD_U may include an air gap AG, which is formed between adjacent ones of the M2 interconnection lines M2_IL. The air gap AG may make it possible to lower a parasitic capacitance between the M2 interconnection lines M2_IL and thereby to improve electric characteristics of a semiconductor device. Meanwhile, the air gap AG may not be formed in the lower interlayer insulating layer ILD_L.

The afore-described structure of the M2 interconnection line M2_IL may be applied not only to the interconnection line in the second metal layer M2 but also to that in another metal layer (e.g., at least one of M1, M2, M3, M4, and M5 layers). For example, a semiconductor device according to an embodiment of the inventive concept may include an $M_X$ layer, in which an interconnection line has substantially the same or similar structure as the afore-described M2 interconnection line M2_IL, where X is an integer that is greater than or equal to one. The interconnection line (i.e., an $M_X$ interconnection line) in the $M_X$ layer according to an embodiment of the inventive concept may include a lower via $V_{X-1}$, an interconnection line $M_X$, and an upper via $V_X$, which are connected to each other to form a single object. The lower via $V_{X-1}$, the interconnection line $M_X$, and the upper via $V_X$ of the $M_X$ interconnection line may be realized in a single metal layer. For example, the lower via $V_{X-1}$, the interconnection line $M_X$, and the upper via $V_X$ of the $M_X$ interconnection line may correspond to the lower via portion LVI, line portion IL, and the upper via portion UVI of the M2 interconnection line M2_IL.

In a conventional BEOL process according to a comparative example, at least two of the lower via $V_{X-1}$, the interconnection line $M_X$, and the upper via $V_X$ may be independently formed by separate processes. In a comparative example, the lower via $V_{X-1}$ and the interconnection line $M_X$ in the $M_X$ layer may be formed by a dual damascene process, and the upper via $V_X$ in the $M_{X+1}$ layer thereon may be formed by a process different from the dual damascene process. In this case, it may be necessary to provide an additional etch stop layer between the $M_X$ layer and the $M_{X+1}$ layer. In addition, due to a technical restriction in the dual damascene process, there may be a limitation in height of the interconnection line $M_X$.

By contrast, according to example embodiments of the inventive concept, by combining a damascene process and a metal etching process, it may be possible to realize all of the lower via $V_{X-1}$, the interconnection line $M_X$, and the upper via $V_X$ from a single conductive layer (e.g., MTL). Thus, according to an embodiment of the inventive concept, an additional etch stop layer may not be required in the afore-described comparative example. In the semiconductor device according to an embodiment of the inventive concept, it may be possible to reduce the number of the etch stop layer and thereby to reduce a parasitic capacitance.

According to an embodiment of the inventive concept, since an upper portion of the interconnection line $M_X$ is formed by a metal etching process, there may be no restriction in height of the interconnection line $M_X$ which occurs in a damascene process. For example, the interconnection line $M_X$ may have a relatively large height and a high aspect ratio. Accordingly, it may be possible to reduce an electric resistance of the interconnection line ($M_X$) and to improve electric characteristics of a semiconductor device.

FIGS. 8 to 11 are sectional views, which are respectively taken along the line A-A' of FIG. 6 to illustrate a semiconductor device according to example embodiments of the inventive concept. In the present embodiments, an element previously described with reference to FIGS. 6, 7A, and 7B may be identified by a similar or identical reference number without repeating an overlapping description thereof, for concise description.

Figure 8:
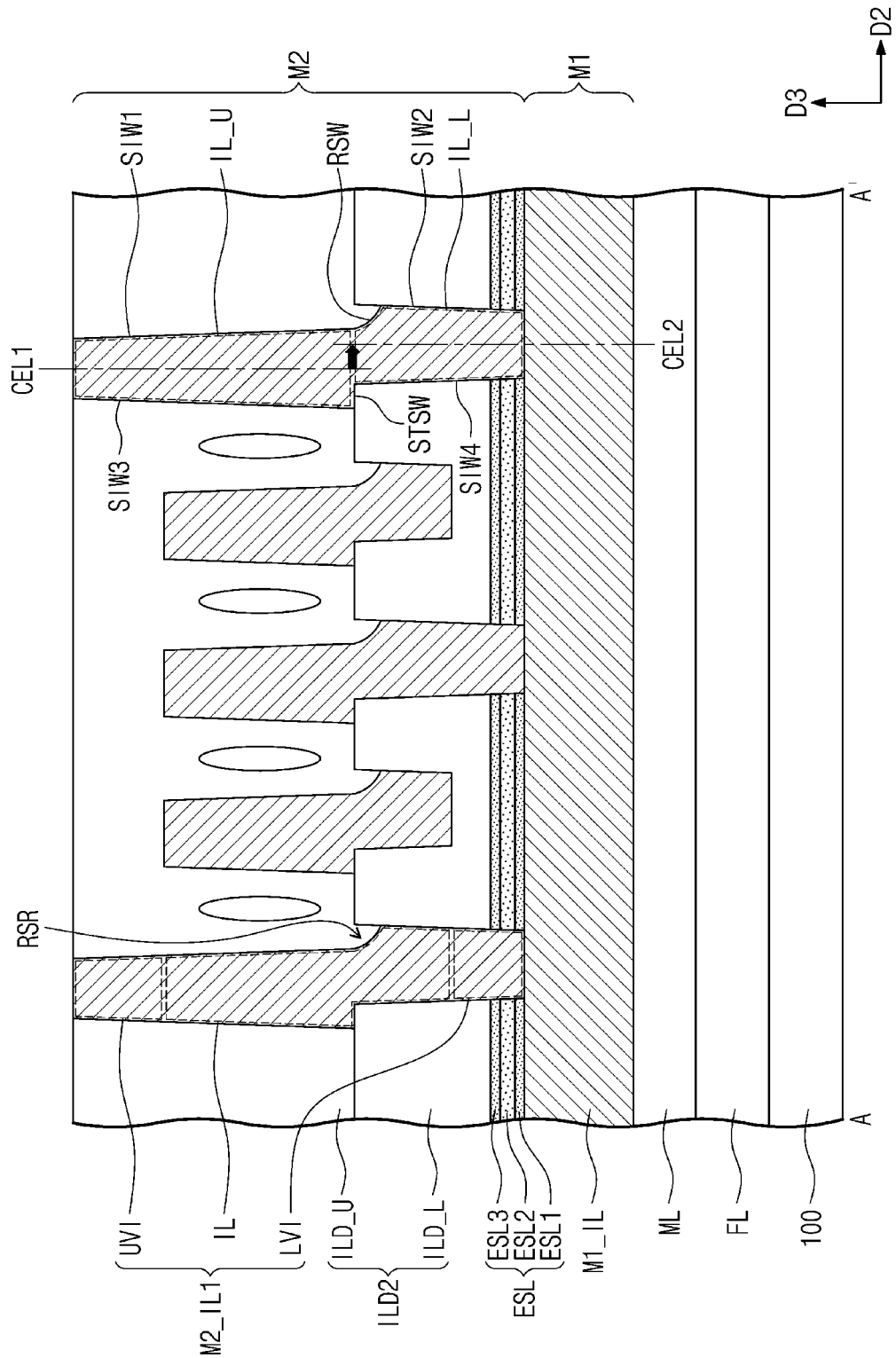
FIGS. 8 to 11 are sectional views, which are respectively taken along the line A-A' of FIG. 6 to illustrate a semiconductor device according to example embodiments of the inventive concept.

Referring to FIG. 8, the upper and lower portions IL_U and IL_L of the M2 interconnection line M2_IL may not be aligned to each other or may be offset from each other. There may be a misalignment issue between the upper and lower portions IL_U and IL_L. For example, the lower portion IL_L may be offset from the upper portion IL_U in the second direction D2.

In detail, a first center line CEL1 may be defined to pass through a center of the upper portion IL_U, and a second center line CEL2 may be defined to pass through a center of the lower portion IL_L. Here, the second center line CEL2 may not be aligned to the first center line CEL1 and may be offset or spaced apart from the first center line CEL1 in the second direction D2.

The M2 interconnection line M2_IL may include a recessed side surface RSW provided between the first side surface SIW1 of the upper portion IL_U and the second side surface SIW2 of the lower portion IL_L. The recessed side surface RSW may be lower than the top surface of the lower interlayer insulating layer ILD_L.

The lower interlayer insulating layer ILD_L may include a recessed region RSR exposing the recessed side surface RSW. The recessed region RSR may be defined by recessing the top surface of the lower interlayer insulating layer ILD_L. The recessed region RSR may be filled with the upper interlayer insulating layer ILD_U. The upper interlayer insulating layer ILD_U filling the recessed region RSR may directly cover the recessed side surface RSW of the M2 interconnection line M2_IL.

The upper portion IL_U may include a third side surface SIW3, which is opposite to the first side surface SIW1, and the lower portion IL_L may include a fourth side surface SIW4, which is opposite to the second side surface SIW2. The M2 interconnection line M2_IL may further include a stepwise side surface STSW between the third side surface SIW3 of the upper portion IL_U and the fourth side surface SIW4 of the lower portion IL_L. The stepwise side surface STSW may be defined at an interface between the lower and upper interlayer insulating layers ILD_L and ILD_U. The stepwise side surface STSW may result from a stepwise structure, which is formed by the offset between the upper portion IL_U and the lower portion IL_L.

The lower portion IL_L of the M2 interconnection line M2_IL may be formed by the afore-described damascene process using the interconnection trench UIT of FIGS. 1 and 2. The upper portion IL_U of the M2 interconnection line M2_IL may be formed by the afore-described etching process using the third mask pattern LMP of FIG. 3. In the case where the third mask pattern LMP is misaligned to the interconnection trench UIT, the upper portion IL_U may be formed at a position offset from the lower portion IL_L. The recessed side surface RSW and the recessed region RSR described above may be formed when the conductive layer MTL in the interconnection trench UIT is over-etched.

Figure 9:
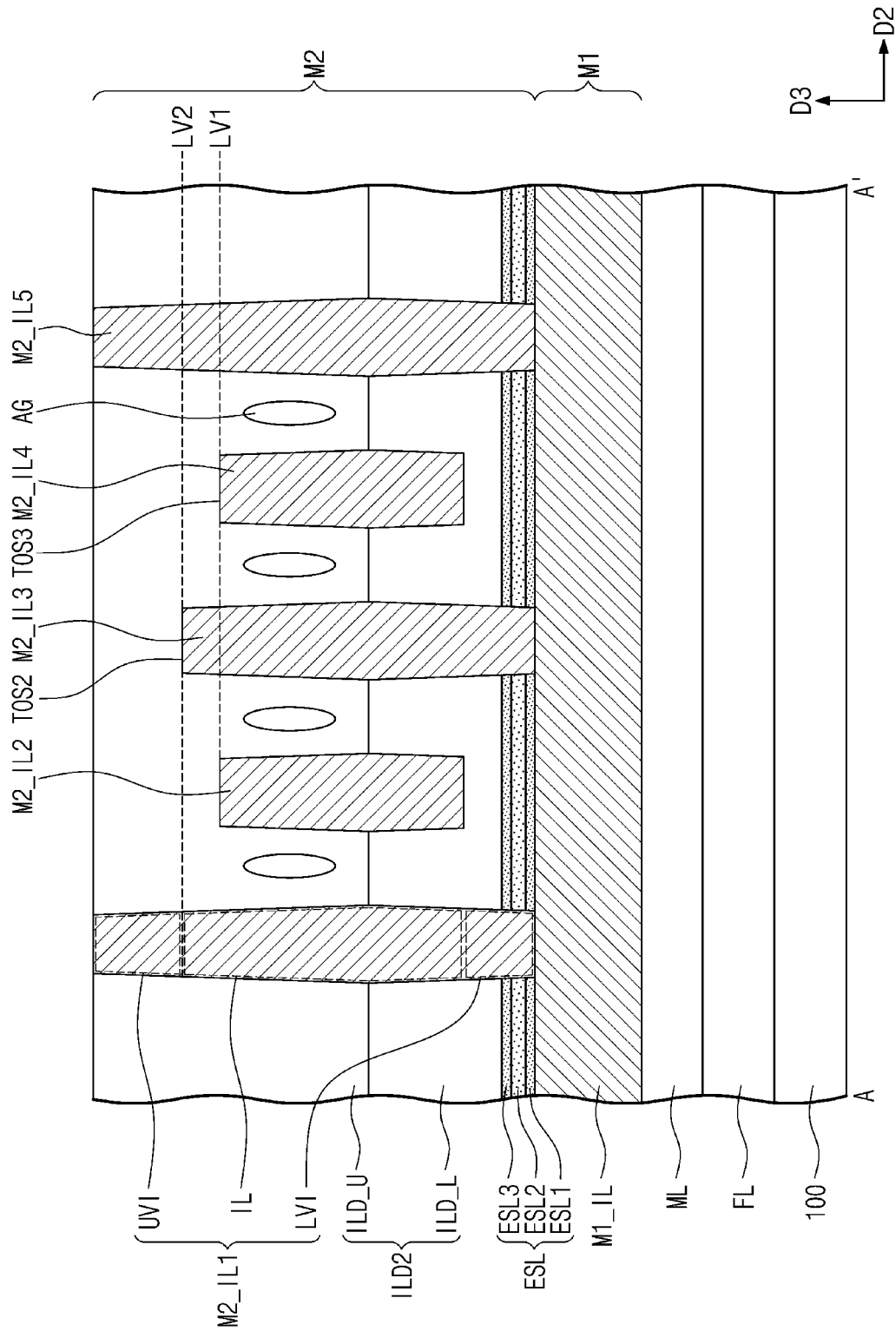

Referring to FIG. 9, the line portions IL of the first to fifth M2 interconnection lines M2_IL1 to M2_IL5 may be provided to have different heights. In detail, a top surface of the line portion IL of each of the second and fourth M2 interconnection lines M2_IL2 and M2_IL4 may be located at a first level LV1. A top surface of the line portion IL of each of the first, third, and fifth M2 interconnection lines M2_IL1, M2_IL3, and M2_IL5 may be located at a second level LV2. Here, the second level LV2 may be different from the first level LV1. For example, the second level LV2 may be higher than the first level LV1.

In the present embodiment, the line portions IL of the first to fifth M2 interconnection lines M2_IL1 to M2_IL5 may have different heights, which are changed in an alternating manner. In a comparative example, the line portions IL may be provided to have the same height, and in this case, the line portions IL may have a relatively increased parasitic capacitance. Meanwhile, in the case where the heights of the line portions IL are changed in an alternating manner as in the present embodiment, a parasitic capacitance between the line portions IL may have a relatively small value.

Figure 10:
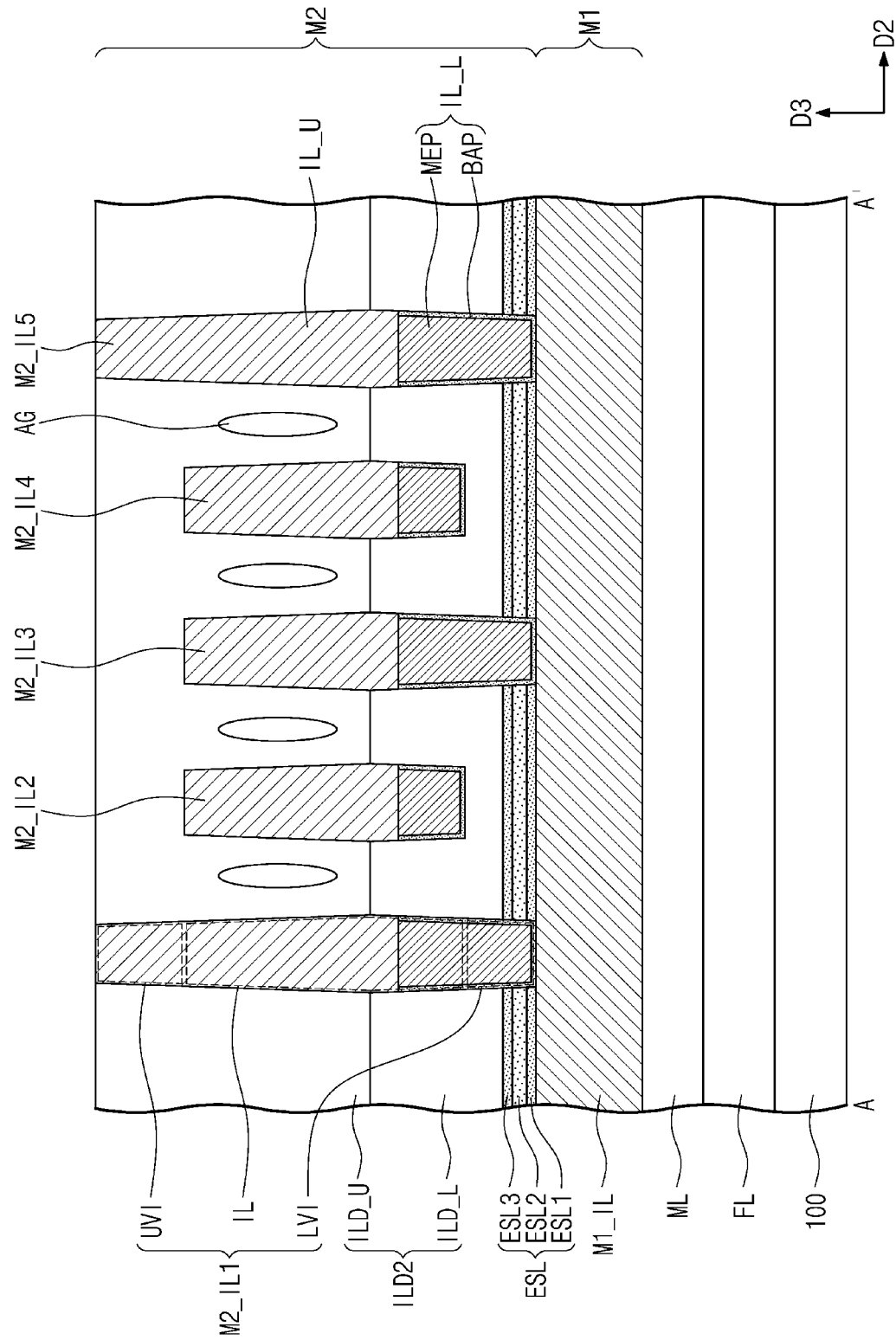

Referring to FIG. 10, the M2 interconnection line M2_IL may be formed of or include two or more different metallic materials. In detail, the lower portion IL_L of the M2 interconnection line M2_IL may include a barrier metal pattern BAP and a metal pattern MEP on the barrier metal pattern BAP.

The barrier metal pattern BAP may be configured to improve an adhesion property between the metal pattern MEP and the lower interlayer insulating layer ILD_L. The barrier metal pattern BAP may serve as a barrier preventing a metallic element in the metal pattern MEP from being diffused into the lower interlayer insulating layer ILD_L. The barrier metal pattern BAP may be formed of or include at least one of tantalum nitride (TaN), titanium nitride (TiN), tantalum oxide (TaO), titanium oxide (TiO), manganese nitride (MnN), and manganese oxide (MnO).

The metal pattern MEP may be provided on the barrier metal pattern BAP. The barrier metal pattern BAP may cover side and bottom surfaces of the metal pattern MEP. According to an embodiment, the metal pattern MEP may have a top surface that is lower than the top surface of the lower interlayer insulating layer ILD_L. In this case, the upper portion IL_U of the M2 interconnection line M2_IL may be buried in the upper interlayer insulating layer ILD_U and in a portion of the lower interlayer insulating layer ILD_L. In an embodiment, the top surface of the metal pattern MEP may be located at the same level as the top surface of the lower interlayer insulating layer ILD_L. In this case, the upper portion IL_U of the M2 interconnection line M2_IL may be buried in the upper interlayer insulating layer ILD_U and the lower interlayer insulating layer ILD_L of the M2 interconnection line M2_IL may be buried in the lower interlayer insulating layer ILD_L.

A volume of the metal pattern MEP may be larger than a volume of the barrier metal pattern BAP. The metal pattern MEP may be formed of or include a material selected from the group consisting of copper (Cu), aluminum (Al), ruthenium (Ru), cobalt (Co), tungsten (W), molybdenum (Mo), aluminum binary alloys, Mo binary alloys, Ru binary alloys, Ni binary alloys, MAX, and combinations thereof.

In an embodiment, a metal capping pattern may be additionally provided on the top surface of the metal pattern MEP. The metal capping pattern may have a small uniform thickness. For example, the metal capping pattern may be formed of or include at least one of ruthenium (Ru), cobalt (Co), and graphene.

The lower portion IL_L, which is composed of the barrier metal pattern BAP and the metal pattern MEP, may be used as the lower via portion LVI. In an embodiment, the barrier metal pattern BAP and the metal pattern MEP may constitute at least a portion of the line portion IL.

In an embodiment, the upper portion IL_U of the M2 interconnection line M2_IL may include only the metal pattern, without the barrier metal pattern. The upper portion IL_U of the M2 interconnection line M2_IL may be formed of or include a metallic material different from the lower portion IL_L. For example, the upper portion IL_U of the M2 interconnection line M2_IL may be formed of or include a metallic material (e.g., molybdenum (Mo), ruthenium (Ru), tungsten (W), cobalt (Co), or binary metals provided as combinations of them). The metallic material in the upper portion IL_U of the M2 interconnection line M2_IL may constitute the line portion IL and the upper via portion UVI.

Even when a single metallic material is used as a via plug and an interconnection line, an electric resistance required for the via plug may be different from that for the interconnection line. In the present embodiment, the lower via portion LVI may be formed of or include a metallic material whose electrical resistance is chosen to be suitable for the lower portion IL_L, and the line portion IL and the upper via portion UVI may be formed of or include a metallic material whose electrical resistance is chosen to be suitable for the upper portion IL_U. Thus, it may be possible to realize the M2 interconnection line M2_IL having an optimized resistance.

Figure 11:
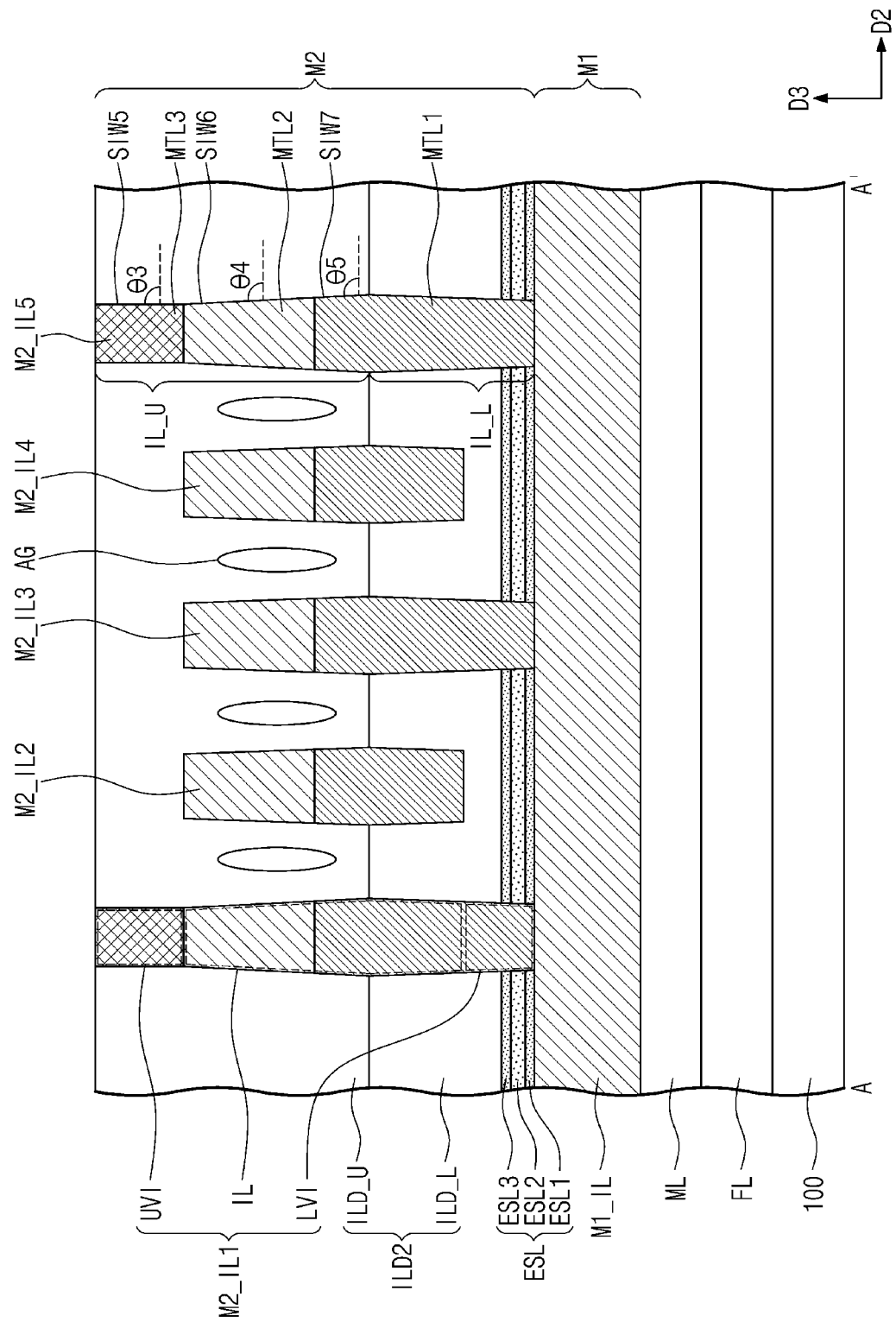

Referring to FIG. 11, the M2 interconnection line M2_IL may include at least two stacked conductive layers. In the present embodiment, the M2 interconnection line M2_IL may include a first conductive layer MTL1, a second conductive layer MTL2, and a third conductive layer MTL3, which are sequentially stacked. The first conductive layer MTL1 may constitute a portion of the line portion IL and the lower via portion LVI. The second conductive layer MTL2 may constitute a remaining portion of the line portion IL. The third conductive layer MTL3 may constitute the upper via portion UVI.

The first to third conductive layers MTL1, MTL2, and MTL3 may be formed of or include different metallic materials from each other. The first conductive layer MTL1 may be formed of a metallic material, which can have a relatively small resistance when it is used as the lower via portion LVI, the second conductive layer MTL2 may be formed of a metallic material, which can have a relatively small resistance when it is used as the line portion IL, and the third conductive layer MTL3 may be formed of a metallic material, which can have a relatively small resistance when it is used as the upper via portion UVI. For example, the first conductive layer MTL1 may be formed of or include molybdenum (Mo), the second conductive layer MTL2 may be formed of or include tungsten (W), and the third conductive layer MTL3 may be formed of or include ruthenium (Ru).

Since the first to third conductive layers MTL1, MTL2, and MTL3 include different metallic materials, the first to third conductive layers MTL1, MTL2, and MTL3 may have etching profiles different from each other, after the etching process for forming the upper portion IL_U of the M2 interconnection line M2_IL.

A fifth side surface SIW5 of the third conductive layer MTL3, a sixth side surface SIW6 of the second conductive layer MTL2, and a seventh side surface SIW7 of the first conductive layer MTL1 may have different slopes from each other. For example, an angle θ3 of the fifth side surface SIW5 relative to the top surface of the substrate 100, an angle θ4 of the sixth side surface SIW6 relative to the top surface of the substrate 100, and an angle θ5 of the seventh side surface SIW7 relative to the top surface of the substrate 100 may be different from each other.

A method of forming the M2 interconnection line M2_IL according to the present embodiment may include sequentially forming the first conductive layer MTL1, the second conductive layer MTL2, and the third conductive layer MTL3 in the step of forming the conductive layer MTL previously described with reference to FIG. 2.

Figure 12:
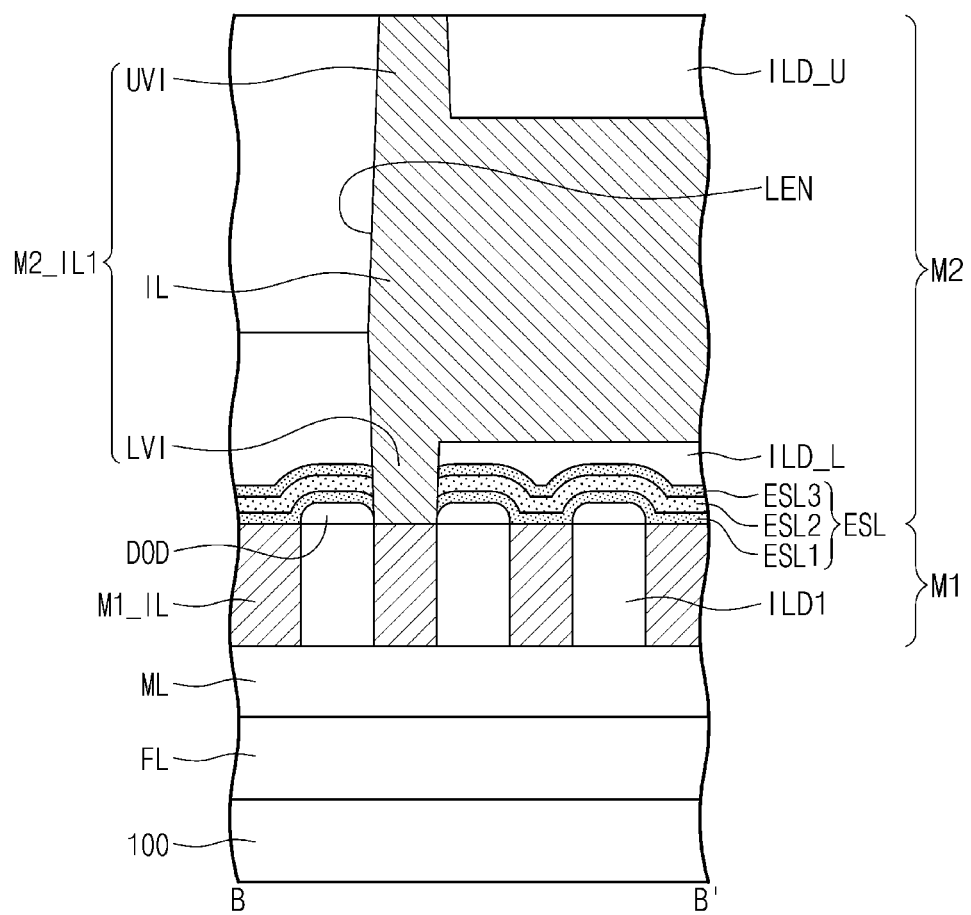
FIG. 12 is a sectional view taken along the line B-B' of FIG. 6 to illustrate a semiconductor device according to an embodiment of the inventive concept.

FIG. 12 is a sectional view taken along the line B-B' of FIG. 6 to illustrate a semiconductor device according to an embodiment of the inventive concept. For concise description, an element previously described with reference to FIGS. 6, 7A, and 7B may be identified by the same reference number without repeating an overlapping description thereof.

Referring to FIG. 12, the lower via portion LVI and the upper via portion UVI of the M2 interconnection line M2_IL may be located at an end LEN of the line portion IL. For example, a side surface of the lower via portion LVI may be aligned to the end LEN of the line portion IL. A side surface of the upper via portion UVI may be aligned to the end LEN of the line portion IL.

In a conventional dual damascene process according to a comparative example, since a trench is formed to have a relatively high aspect ratio, it may be difficult to align a lower via to an end of an interconnection line. In other words, there should be a margin between the lower via and the end of the interconnection line.

By contrast, in a method of forming the M2 interconnection line M2_IL according to an embodiment of the inventive concept, since the interconnection trench UIT of FIG. 2, which is used in the damascene process, has a relatively small aspect ratio, the margin between the lower via portion LVI and the end LEN of the line portion IL may not be needed. Thus, the lower via portion LVI may be formed to have a side surface that is aligned to the end LEN of the line portion IL.

According to an embodiment of the inventive concept, since the upper via portion UVI is formed using the same mask as that for the line portion IL, the upper via portion UVI may also be formed to have a side surface that is aligned to the end LEN of the line portion IL.

According to the present embodiment, to secure a margin for forming a lower or upper via, it may be unnecessary to extend the line portion IL, and thus, a length of the M2 interconnection line M2_IL may be reduced. Accordingly, it may be possible to increase an integration density of a semiconductor device and to realize a semiconductor device with improved electric characteristics (e.g., low parasitic capacitance).

Figure 13:
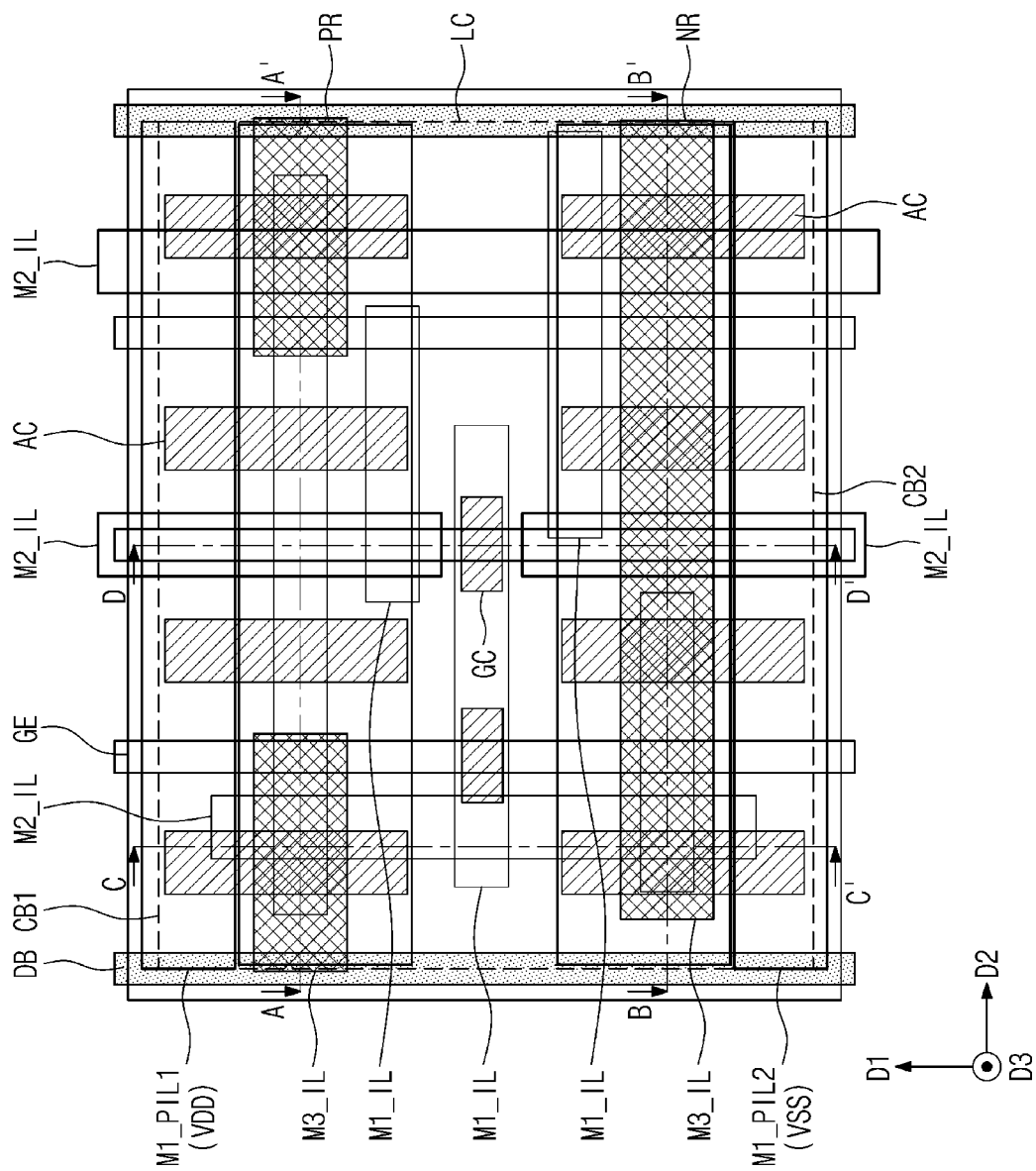
FIG. 13 is a plan view illustrating a semiconductor device according to an embodiment of the inventive concept.
Figure 14A:
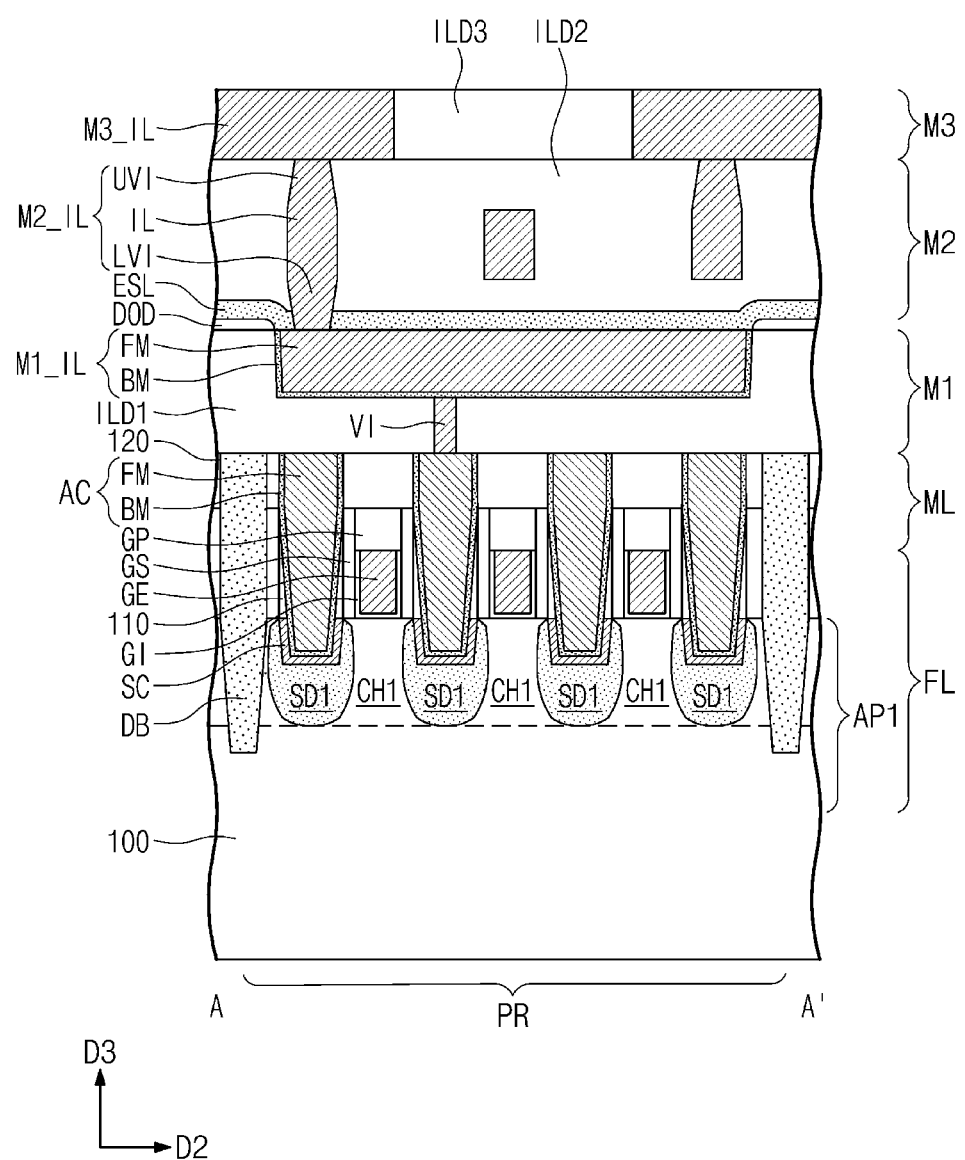
FIGS. 14A to 14D are sectional views, which are respectively taken along lines A-A', B-B', C-C', and D-D' of FIG. 13 according to example embodiments.
Figure 14B:
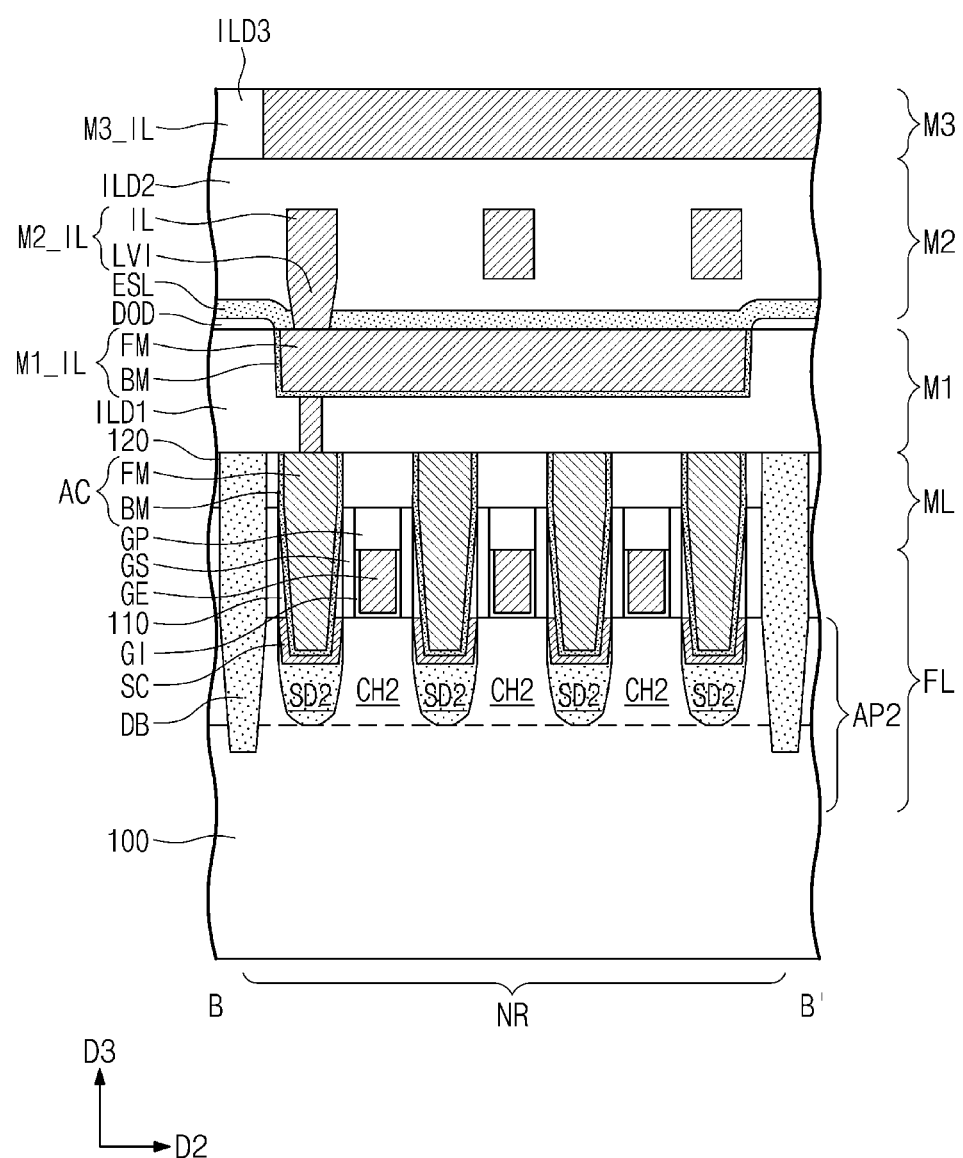
Figure 14C:
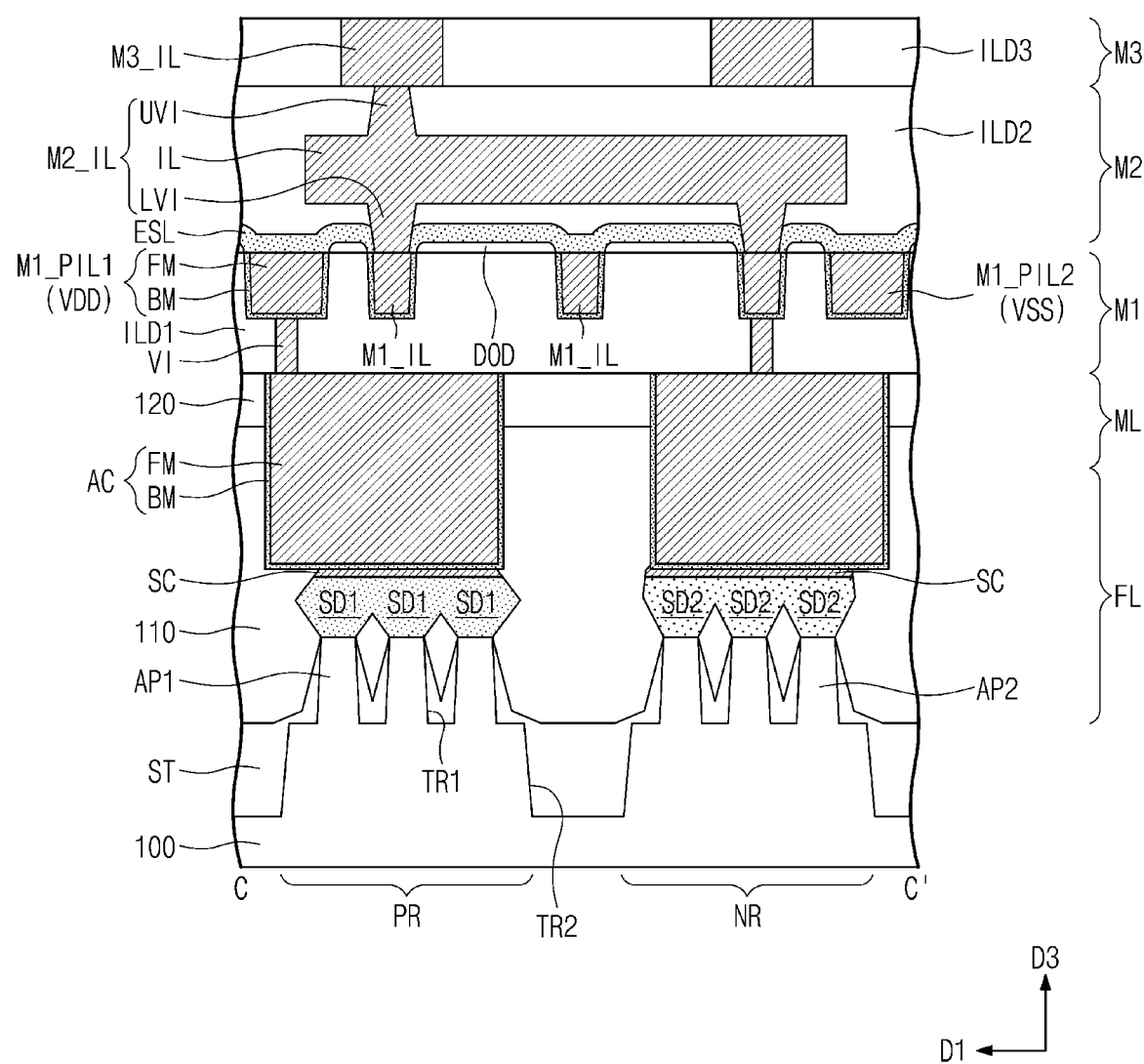
Figure 14D:
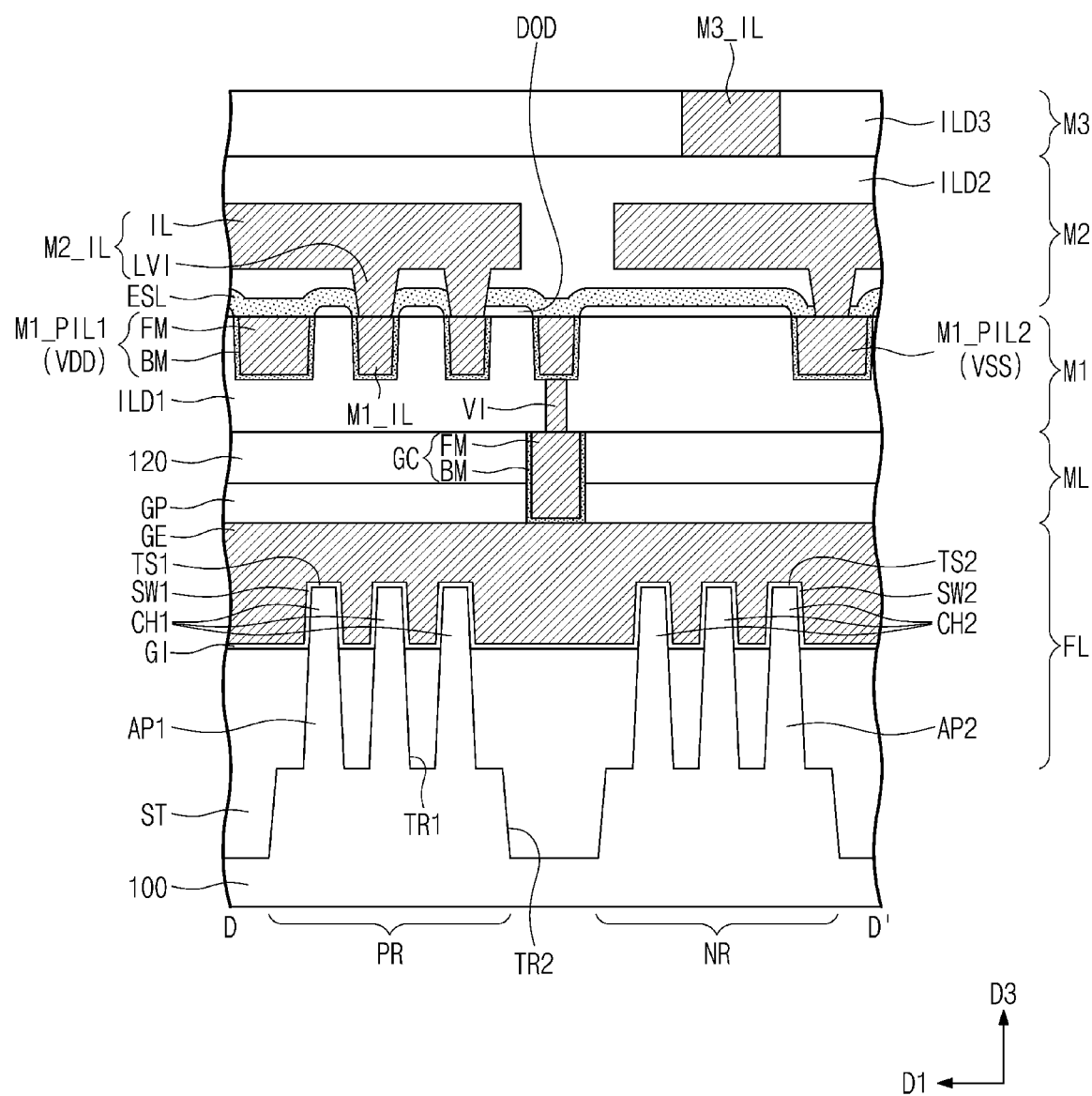

FIG. 13 is a plan view illustrating a semiconductor device according to an embodiment of the inventive concept. FIGS. 14A to 14D are sectional views, which are respectively taken along lines A-A', B-B', C-C', and D-D' of FIG. 13 according to example embodiments.

Referring to FIGS. 13 and 14A to 14D, a logic cell LC may be provided on the substrate 100. In the present specification, the logic cell LC may mean a logic device (e.g., an inverter, a flip-flop, and so forth), which is configured to execute a specific function. For example, the logic cell LC may include transistors constituting the logic device and interconnection lines connecting transistors to each other.

The FEOL layer FL may be provided on the substrate 100. Hereinafter, the FEOL layer FL according to the present embodiment will be described in more detail below. The substrate 100 may include a first active region PR and a second active region NR. The first active region PR may be a p-type metal-oxide-semiconductor field-effect transistor (PMOSFET) region, and the second active region NR may be an n-type metal-oxide-semiconductor field-effect transistor (NMOSFET) region.

The first and second active regions PR and NR may be defined by a second trench TR2, which is formed in an upper portion of the substrate 100. The second trench TR2 may be located between the first and second active regions PR and NR. The first and second active regions PR and NR may be spaced apart from each other, in the first direction D1, with the second trench TR2 interposed therebetween. Each of the first and second active regions PR and NR may be extended in the second direction D2 crossing the first direction D1.

First active patterns AP1 and second active patterns AP2 may be provided on the first active region PR and the second active region NR, respectively. The first and second active patterns AP1 and AP2 may be extended in the second direction D2 to be parallel to each other. The first and second active patterns AP1 and AP2 may be portions of the substrate 100 protruding in a vertical direction (i.e., in the third direction D3). A first trench TR1 may be defined between adjacent ones of the first active patterns AP1 and between adjacent ones of the second active patterns AP2. The first trench TR1 may be shallower than the second trench TR2.

A device isolation layer ST may be provided to fill the first and second trenches TR1 and TR2. The device isolation layer ST may include a silicon oxide layer. Upper portions of the first and second active patterns AP1 and AP2 may protrude vertically above the device isolation layer ST (e.g., see FIG. 14D). Each of the upper portions of the first and second active patterns AP1 and AP2 may be a fin-shaped pattern. The device isolation layer ST may not cover the upper portions of the first and second active patterns AP1 and AP2. The device isolation layer ST may cover lower side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between each pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between each pair of the second source/drain patterns SD2.

The first and second source/drain patterns SD1 and SD2 may be epitaxial patterns, which are formed by a selective epitaxial growth process. In an embodiment, the first and second source/drain patterns SD1 and SD2 may have top surfaces that are coplanar with top surfaces of the first and second channel patterns CH1 and CH2. Alternatively, the top surfaces of the first and second source/drain patterns SD1 and SD2 may be higher than the top surfaces of the first and second channel patterns CH1 and CH2.

The first source/drain patterns SD1 may be formed of or include a semiconductor material (e.g., SiGe) having a lattice constant greater than that of the substrate 100. In this case, the first source/drain patterns SD1 may exert a compressive stress on the first channel patterns CH1. As an example, the second source/drain patterns SD2 may be formed of or include the same semiconductor material (e.g., Si) as the substrate 100.

Gate electrodes GE may be provided to cross the first and second active patterns AP1 and AP2 and to extend in the first direction D1. The gate electrodes GE may be arranged at a constant pitch in the second direction D2. The gate electrodes GE may be vertically overlapped with the first and second channel patterns CH1 and CH2. Each of the gate electrodes GE may be provided to face a top surface and opposite side surfaces of each of the first and second channel patterns CH1 and CH2.

Referring back to FIG. 14D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, the transistor according to the present embodiment may be a three-dimensional field-effect transistor (e.g., FinFET), in which the gate electrode GE is provided to surround the channel pattern CH1 or CH2 three-dimensionally.

Referring back to FIGS. 13 and 14A to 14D, a pair of gate spacers GS may be disposed on opposite side surfaces of each of the gate electrodes GE. The gate spacers GS may be extended along the gate electrodes GE and in the first direction D1. Top surfaces of the gate spacers GS may be higher than top surfaces of the gate electrodes GE. The top surfaces of the gate spacers GS may be coplanar with a top surface of a first insulating layer 110 to be described below. The gate spacers GS may be formed of or include at least one of SiCN, SiCON, and SiN. In an embodiment, the gate spacers GS may be a multi-layered structure, which includes at least two different materials selected from SiCN, SiCON, and SiN.

A gate capping pattern GP may be provided on each of the gate electrodes GE. The gate capping pattern GP may be extended along the gate electrode GE and in the first direction D1. The gate capping pattern GP may be formed of or include a material having an etch selectivity with respect to the first insulating layers 110 and a second insulating layer 120 to be described below. In detail, the gate capping patterns GP may be formed of or include at least one of SiON, SiCN, SiCON, and SiN.

A gate insulating layer GI may be interposed between the gate electrode GE and the first active pattern AP1 and between the gate electrode GE and the second active pattern AP2. The gate insulating layer GI may be extended along a bottom surface of the gate electrode GE thereon. As an example, the gate insulating layer GI may cover the first top surface TS1 and the first side surfaces SW1 of the first channel pattern CH1. The gate insulating layer GI may cover the second top surface TS2 and both of the second side surfaces SW2 of the second channel pattern CH2. The gate insulating layer GI may cover a top surface of the device isolation layer ST below the gate electrode GE (e.g., see FIG. 14D).

In an embodiment, the gate insulating layer GI may be formed of or include a high-k dielectric material whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In example embodiments, the semiconductor device may include a negative capacitance (NC) FET using a negative capacitor. For example, the gate insulating layer GI may include a ferroelectric layer exhibiting a ferroelectric property and a paraelectric layer exhibiting a paraelectric property.

The ferroelectric layer may have a negative capacitance, and the paraelectric layer may have a positive capacitance. In the case where two or more capacitors are connected in series and each capacitor has a positive capacitance, a total capacitance may be reduced to a value that is less than a capacitance of each of the capacitors. By contrast, in the case where at least one of serially-connected capacitors has a negative capacitance, a total capacitance of the serially-connected capacitors may have a positive value and may be greater than an absolute value of each capacitance.

In the case where a ferroelectric layer having a negative capacitance and a paraelectric layer having a positive capacitance are connected in series, a total capacitance of the serially-connected ferroelectric and paraelectric layers may be increased. Due to such an increase of the total capacitance, a transistor including the ferroelectric layer may have a subthreshold swing (SS), which is less than 60 mV/decade, at room temperature.

The ferroelectric layer may have the ferroelectric property. The ferroelectric layer may be formed of or include at least one of, for example, hafnium oxide, hafnium zirconium oxide, barium strontium titanium oxide, barium titanium oxide, and/or lead zirconium titanium oxide. Here, the hafnium zirconium oxide may be hafnium oxide that is doped with zirconium (Zr). Alternatively, the hafnium zirconium oxide may be a compound composed of hafnium (Hf), zirconium (Zr), and/or oxygen (O).

The ferroelectric layer may further include dopants. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and/or tin (Sn). The kind of the dopants in the ferroelectric layer may vary depending on a ferroelectric material included in the ferroelectric layer.

In the case where the ferroelectric layer includes hafnium oxide, the dopants in the ferroelectric layer may include at least one of, for example, gadolinium (Gd), silicon (Si), zirconium (Zr), aluminum (Al), and/or yttrium (Y).

In the case where the dopants are aluminum (Al), a content of aluminum in the ferroelectric layer may range from 3 to 8 at % (atomic percentage). Here, the content of the dopants (e.g., aluminum atoms) may be a ratio of the number of aluminum atoms to the number of hafnium and aluminum atoms.

In the case where the dopants are silicon (Si), a content of silicon in the ferroelectric layer may range from 2 at % to 10 at %. In the case where the dopants are yttrium (Y), a content of yttrium in the ferroelectric layer may range from 2 at % to 10 at %. In the case where the dopants are gadolinium (Gd), a content of gadolinium in the ferroelectric layer may range from 1 at % to 7 at %. In the case where the dopants are zirconium (Zr), a content of zirconium in the ferroelectric layer may range from 50 at % to 80 at %.

The paraelectric layer may have the paraelectric property. The paraelectric layer may be formed of or include at least one of, for example, silicon oxide and/or high-k metal oxides. The metal oxides, which can be used as the paraelectric layer, may include at least one of, for example, hafnium oxide, zirconium oxide, and/or aluminum oxide, but the inventive concept is not limited to these examples.

The ferroelectric layer and the paraelectric layer may be formed of or include the same material. The ferroelectric layer may have the ferroelectric property, but the paraelectric layer may not have the ferroelectric property. For example, in the case where the ferroelectric and paraelectric layers contain hafnium oxide, a crystal structure of the hafnium oxide in the ferroelectric layer may be different from a crystal structure of the hafnium oxide in the paraelectric layer.

The ferroelectric layer may exhibit the ferroelectric property, only when its thickness is in a specific range. In an embodiment, the ferroelectric layer may have a thickness ranging from 0.5 to 10 nm, but the inventive concept is not limited to this example. Since a critical thickness associated with the occurrence of the ferroelectric property varies depending on the kind of the ferroelectric material, the thickness of the ferroelectric layer may be changed depending on the kind of the ferroelectric material.

As an example, the gate insulating layer GI may include a single ferroelectric layer. As another example, the gate insulating layer GI may include a plurality of ferroelectric layers spaced apart from each other. The gate insulating layer GI may have a multi-layered structure, in which a plurality of ferroelectric layers and a plurality of paraelectric layers are alternately stacked.

The gate electrode GE may include a first metal pattern and a second metal pattern on the first metal pattern. The first metal pattern may be provided on the gate insulating layer GI and adjacent to the first and second channel patterns CH1 and CH2. The first metal pattern may include a work-function metal, which can be used to adjust a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W), and molybdenum (Mo), and nitrogen (N). The first metal pattern may further contain carbon (C). The first metal pattern may include a plurality of work function metal layers, which are stacked.

The second metal pattern may include a metallic material whose resistance is lower than the first metal pattern. For example, the second metal pattern may include at least one metallic material that is selected from the group consisting of tungsten (W), aluminum (Al), titanium (Ti), and tantalum (Ta).

The first insulating layer 110 may be provided on the substrate 100. The first insulating layer 110 may cover the gate spacers GS and the first and second source/drain patterns SD1 and SD2. A top surface of the first insulating layer 110 may be substantially coplanar with the top surfaces of the gate capping patterns GP and the top surfaces of the gate spacers GS. The second insulating layer 120 may be provided on the first insulating layer 110 to cover the gate capping patterns GP.

A pair of division structures DB may be respectively provided at both sides of the logic cell LC, which are opposite to each other in the second direction D2. The division structure DB may be extended in the first direction D1 to be parallel to the gate electrodes GE.

The division structure DB may be provided to penetrate the first and second insulating layers 110 and 120 and may be extended into the first and second active patterns AP1 and AP2. The division structure DB may be provided to penetrate an upper portion of each of the first and second active patterns AP1 and AP2. The division structure DB may separate the first and second active regions PR and NR of the logic cell LC from the active region of a neighboring logic cell in the second direction D2.

The MOL layer ML may be provided on the FEOL layer FL. Hereinafter, the MOL layer ML according to the present embodiment will be described in more detail below. Active contacts AC may be provided to penetrate the first and second insulating layers 110 and 120 and may be electrically connected to the first and second source/drain patterns SD1 and SD2, respectively. Each of the active contacts AC may be provided between a pair of the gate electrodes GE.

An active contact AC may be a self-aligned contact. Herein, for convenience of description, the terms of the active contacts AC and the active contact AC may be used interchangeably. For example, the active contact AC may be formed by a self-alignment process using the gate capping pattern GP and the gate spacer GS. In an embodiment, the active contact AC may cover at least a portion of the side surface of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal silicide materials (e.g., titanium silicide, tantalum silicide, tungsten silicide, nickel silicide, and cobalt silicide).

A gate contact GC may be provided to penetrate the second insulating layer 120 and the gate capping pattern GP and may be connected to the gate electrode GE. When viewed in a plan view, the gate contact GC may be provided between the first and second active regions PR and NR. A bottom surface of the gate contact GC may be in contact with a top surface of the gate electrode GE. A top surface of the gate contact GC may be coplanar with a top surface of the second insulating layer 120.

Each of the active and gate contacts AC and GC may include a conductive pattern FM and a barrier pattern BM enclosing the conductive pattern FM. For example, the conductive pattern FM may be formed of or include at least one of metallic materials (e.g., aluminum, copper, tungsten, molybdenum, and cobalt). The barrier pattern BM may be provided to cover side and bottom surfaces of the conductive pattern FM. In an embodiment, the barrier pattern BM may include a metal layer and a metal nitride layer. The metal layer may be formed of or include at least one of titanium, tantalum, tungsten, nickel, cobalt, and platinum. The metal nitride layer may be formed of or include at least one of titanium nitride (TiN), tantalum nitride (TaN), tungsten nitride (WN), nickel nitride (NiN), cobalt nitride (CoN), and platinum nitride (PtN).

The BEOL layer may be provided on the MOL layer ML. In the present embodiment, the BEOL layer may include a first metal layer M1, a second metal layer M2, and a third metal layer M3, which are sequentially stacked.

In detail, the first metal layer M1 may be provided in the first interlayer insulating layer ILD1 on the MOL layer ML. The first metal layer M1 may include first and second power lines M1_PIL1 and M1_PIL2, the M1 interconnection lines M1_IL, and vias VI. The vias VI may be provided below the first and second power lines M1_PIL1 and M1_PIL2 and the M1 interconnection lines M1_IL.

The first and second power lines M1_PIL1 and M1_PIL2 may be extended in the second direction D2 to cross the logic cell LC and to be parallel to each other. The first and second power lines M1_PIL1 and M1_PIL2 may be applied with a drain voltage (or a power supply voltage) VDD and a source voltage (or a ground voltage) VSS, respectively.

Referring to FIG. 13, a first cell border CB1, which is extended in the second direction D2, may be defined in the logic cell LC. A second cell border CB2, which is opposite to the first cell border CB1 and is extended in the second direction D2, may be defined in the logic cell LC. The first power line M1_PIL1 applied with the drain voltage VDD may be disposed on the first cell border CB1. For example, the first power line M1_PIL1 applied with the drain voltage VDD may be extended along the first cell border CB1 and in the second direction D2. The second power line M1_PIL2 applied with the source voltage VSS (i.e., the ground voltage) may be disposed on the second cell border CB2. For example, the second power line M1_PIL2 applied with the source voltage VSS may be extended along the second cell border CB2 and in the second direction D2.

The M1 interconnection lines M1_IL may be disposed between the first power line M1_PIL1 and the second power line M1_PIL2. The M1 interconnection lines M1_IL may be extended in the second direction D2 to be parallel to each other. When viewed in a plan view, each of the M1 interconnection lines M1_IL may have a line shape or bar shape. The M1 interconnection lines M1_IL may be arranged in the first direction D1. In the first direction D1, a line width of each of the first and second power lines M1_PIL1 and M1_PIL2 may be larger than a line width of each of the M1 interconnection lines M1_IL.

The vias VI may be interposed between the first and second power lines M1_PIL1 and M1_PIL2 and the active contacts AC. The vias VI may be interposed between the M1 interconnection lines M1_IL and the active and gate contacts AC and GC.

Each of the first and second power lines M1_PIL1 and M1_PIL2 and the M1 interconnection lines M1_IL may include the barrier pattern BM and the conductive pattern FM on the barrier pattern BM. The barrier pattern BM may have a 'U' shape. The barrier pattern BM may be provided to cover side and bottom surfaces of the conductive pattern FM. The barrier pattern BM and the conductive pattern FM may be configured to have substantially the same features as those in the active and gate contacts AC and GC described above.

The second metal layer M2 may be provided in the second interlayer insulating layer ILD2 on the first metal layer M1. In an embodiment, the dielectric layer DOD and the etch stop layer ESL may be interposed between the first interlayer insulating layer ILD1 and the second interlayer insulating layer ILD2. The second metal layer M2 may include the M2 interconnection lines M2_IL. The M2 interconnection lines M2_IL may be extended in the first direction D1 and parallel to each other. Each of the M2 interconnection lines M2_IL may include the lower via portion LVI, the line portion IL, and the upper via portion UVI. The second metal layer M2 and the M2 interconnection lines M2_IL may be configured to have substantially the same features as those in the embodiment described with reference to FIGS. 1 to 6, 7A, 7B, and 8 to 12.

The third metal layer M3 may be provided in a third interlayer insulating layer ILD3 on the second metal layer M2. The third metal layer M3 may include M3 interconnection lines M3_IL. The M3 interconnection lines M3_IL may be extended in the second direction D2 and parallel to each other.

In an embodiment, the M3 interconnection line M3_IL may be in contact with the upper via portion UVI of the M2 interconnection line M2_IL. For example, the M2 interconnection line M2_IL and the M3 interconnection line M3_IL may be electrically connected to each other through the upper via portion UVI. In an embodiment, the M3 interconnection line M3_IL may include a via provided in a lower portion thereof. The via of the M3 interconnection line M3_IL may be in contact with the upper via portion UVI of the M2 interconnection line M2_IL.

According to an embodiment of the inventive concept, additional metal layers (e.g., M4, M5, M6, and so forth) may be stacked on the third metal layer M3.

Figure 20A:
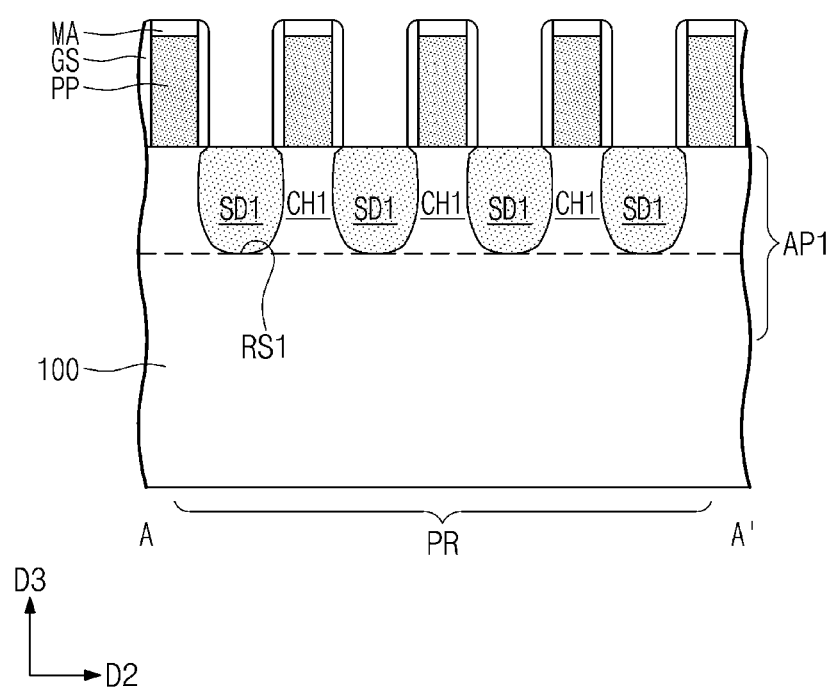
Figure 20B:
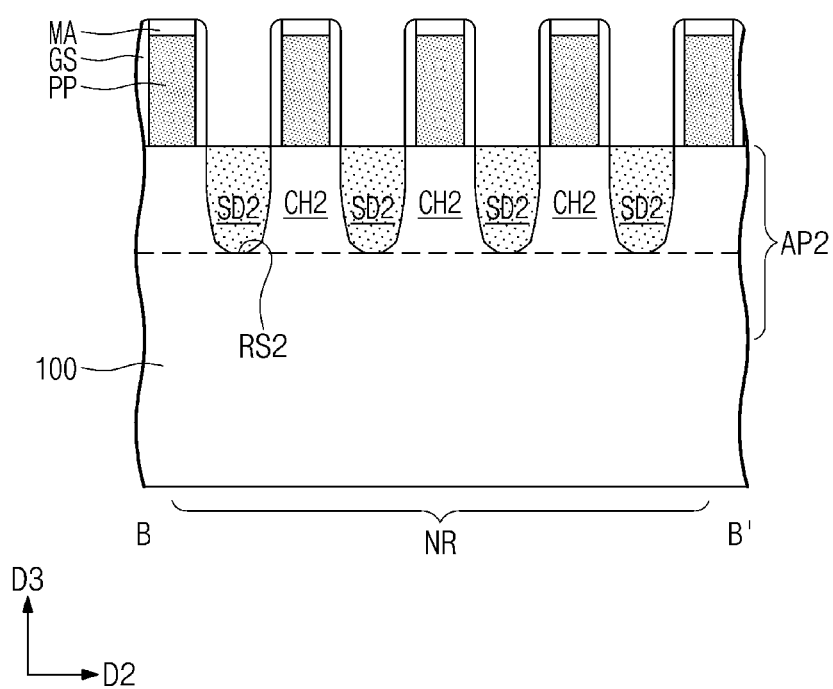
Figure 20C:
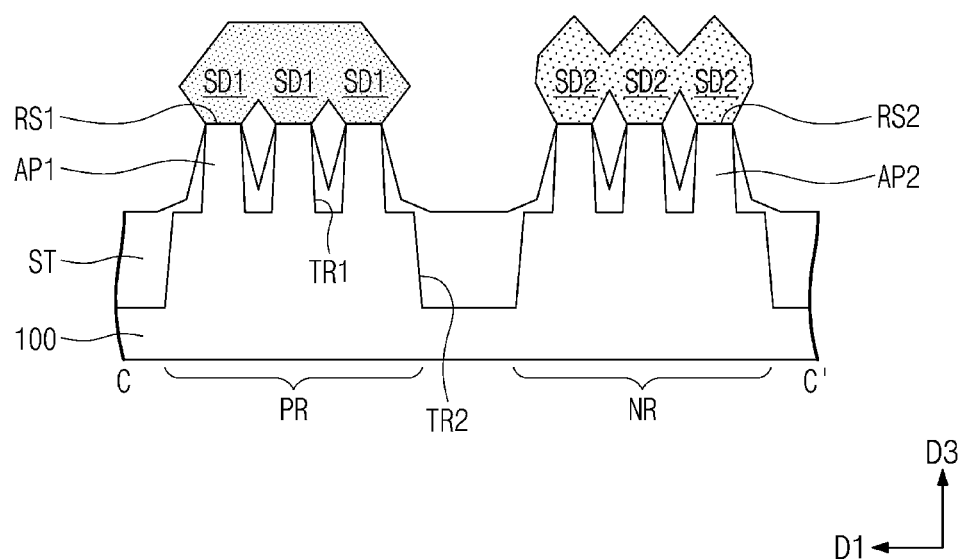
FIGS. 20C and 22C are sectional views, which are respectively taken along lines C-C' of FIGS. 19 and 21 according to example embodiments.
Figure 20D:
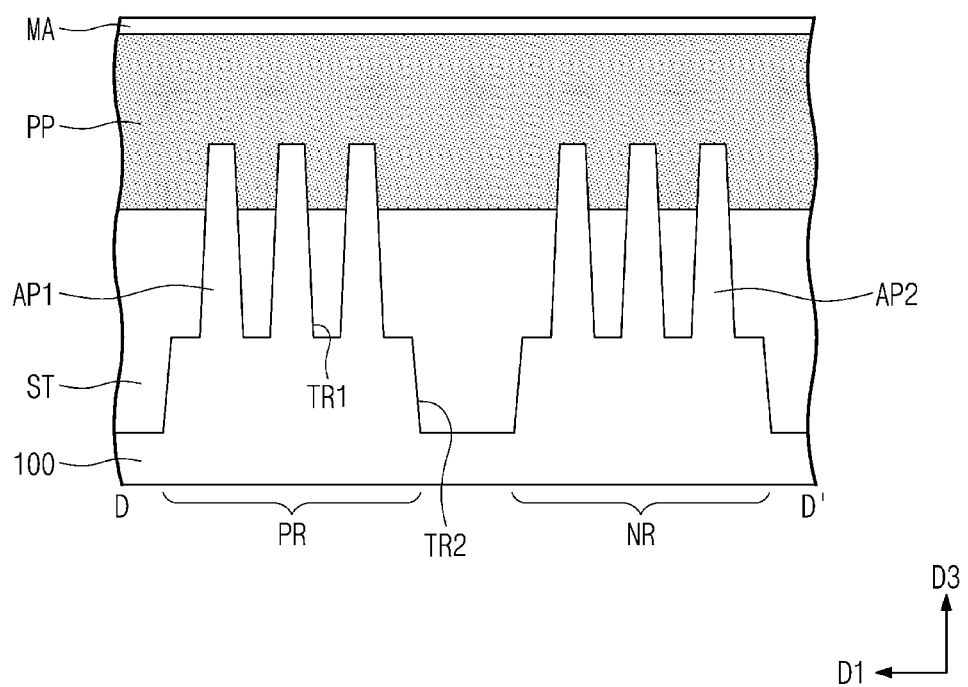
FIGS. 20D and 22D are sectional views, which are respectively taken along lines D-D' of FIGS. 19 and 21 according to example embodiments.
Figure 21:
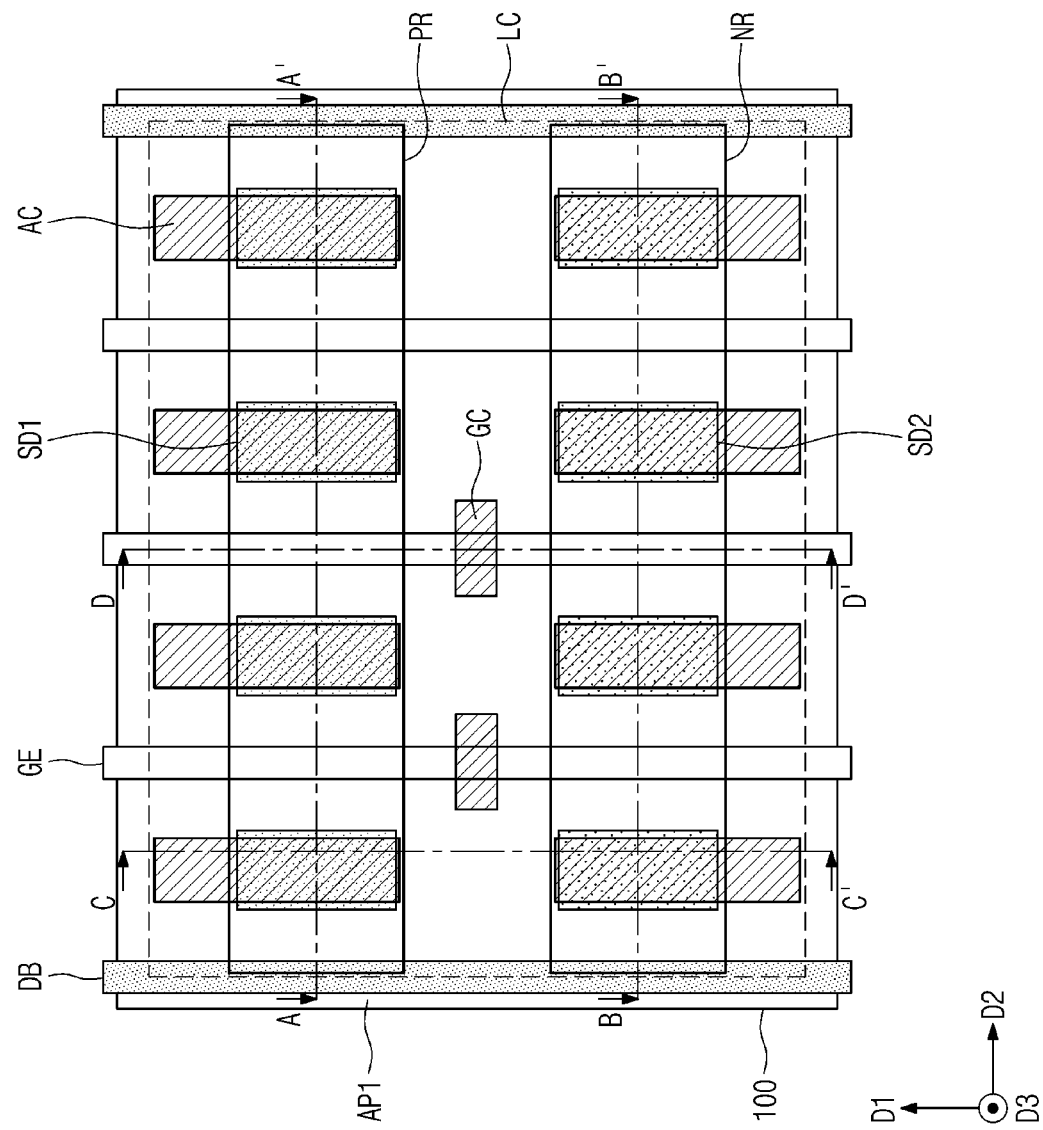
Figure 22A:
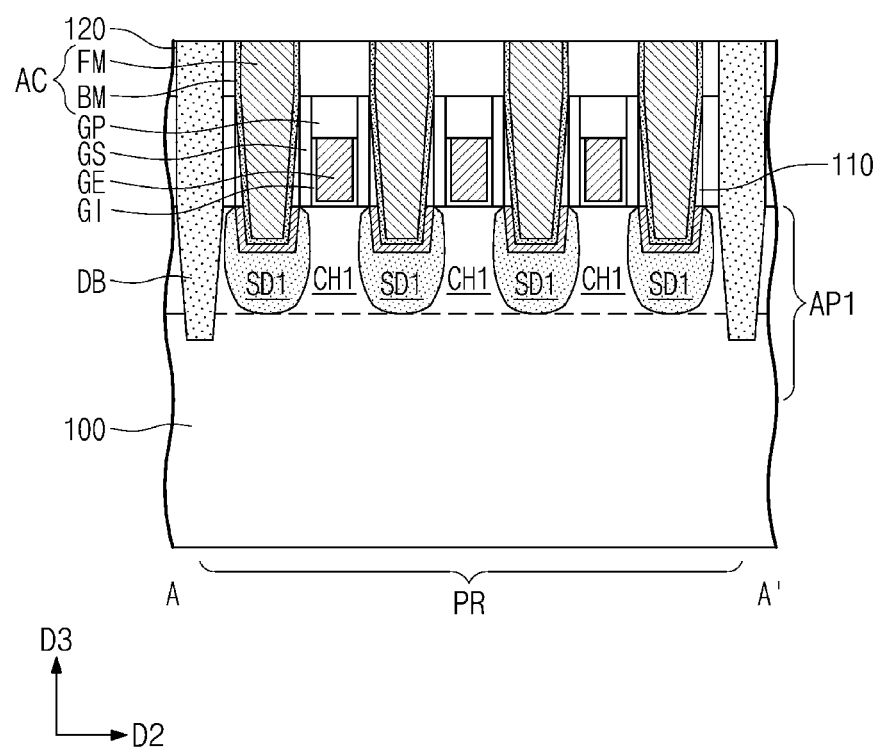
Figure 22B:
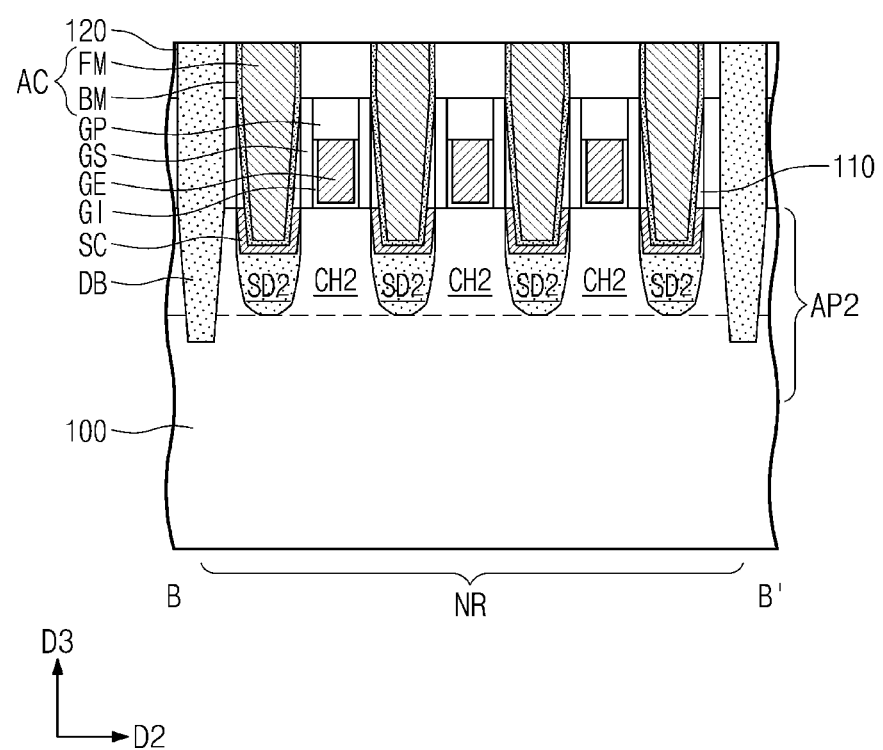
Figure 22C:
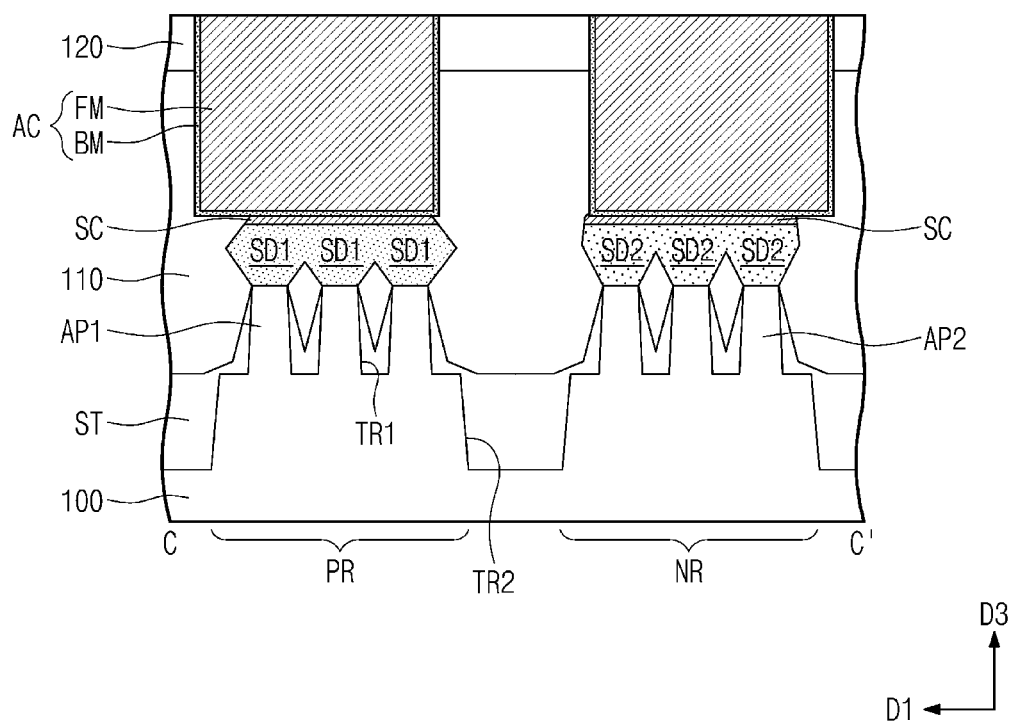
Figure 22D:
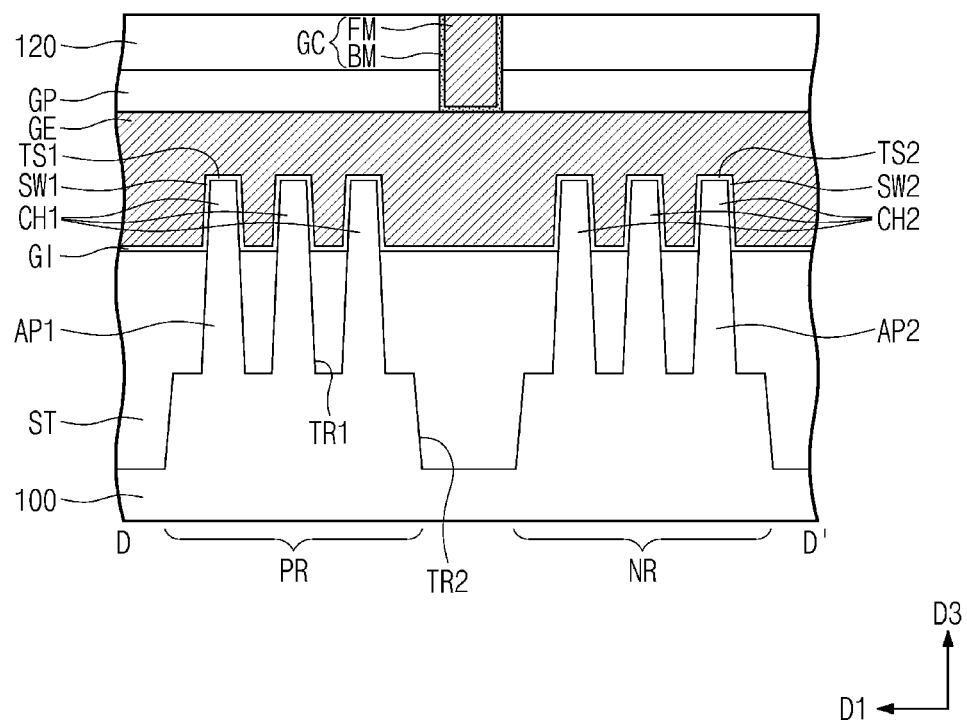

FIGS. 15, 17, 19, and 21 are plan views illustrating a method of fabricating a semiconductor device, according to example embodiments of the inventive concept. FIGS. 16, 18A, 20A, and 22A are sectional views, which are respectively taken along lines A-A' of FIGS. 15, 17, 19, and 21 according to example embodiments. FIGS. 18B, 20B, and 22B are sectional views, which are respectively taken along lines B-B' of FIGS. 17, 19, and 21 according to example embodiments. FIGS. 20C and 22C are sectional views, which are respectively taken along lines C-C' of FIGS. 19 and 21 according to example embodiments. FIGS. 20D and 22D are sectional views, which are respectively taken along lines D-D' of FIGS. 19 and 21 according to example embodiments.

Figure 15:
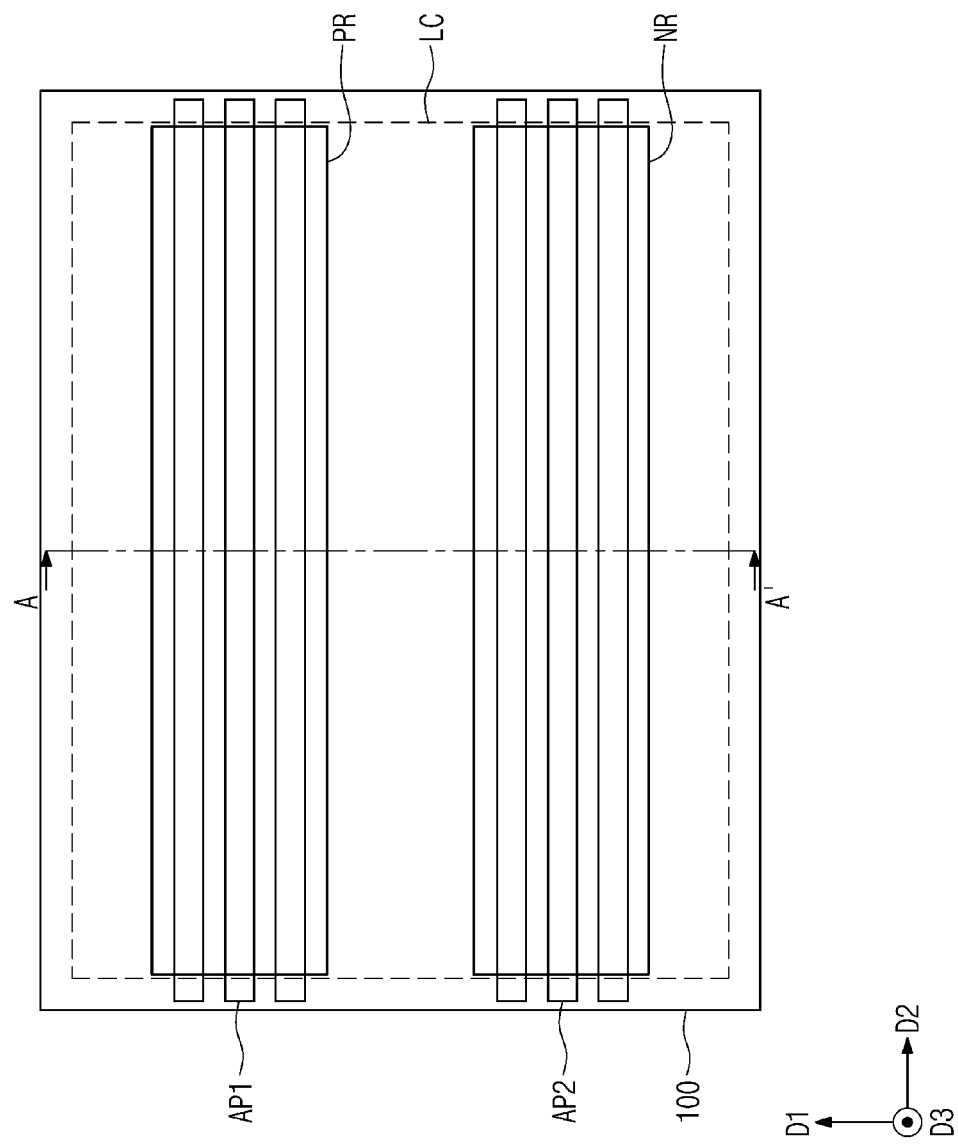
FIGS. 15, 17, 19, and 21 are plan views illustrating a method of fabricating a semiconductor device, according to example embodiments of the inventive concept.
Figure 16:
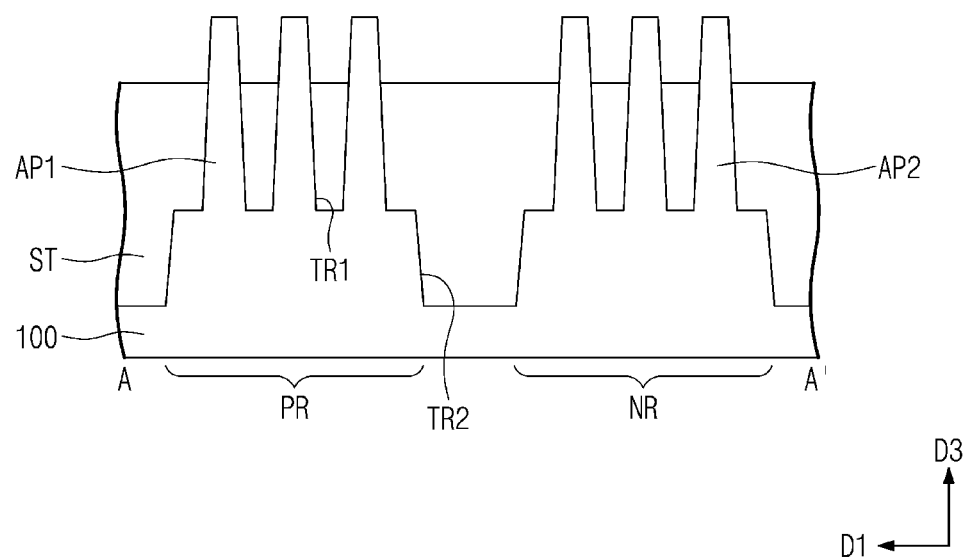
FIGS. 16, 18A, 20A, and 22A are sectional views, which are respectively taken along lines A-A' of FIGS. 15, 17, 19, and 21 according to example embodiments.

Referring to FIGS. 15 and 16, the substrate 100 including the first and second active regions PR and NR may be provided. The first and second active regions PR and NR may constitute the logic cell LC on the substrate 100.

The substrate 100 may be patterned to form the first and second active patterns AP1 and AP2. The first active patterns AP1 may be formed on the first active region PR, and the second active patterns AP2 may be formed on the second active region NR. The first trench TR1 may be formed between the first active patterns AP1 and between the second active patterns AP2. The second trench TR2 may be formed between the first and second active regions PR and NR by patterning a portion of the substrate 100. The second trench TR2 may be formed to have a depth that is larger than that of the first trench TR1.

The device isolation layer ST may be formed on the substrate 100 to fill the first and second trenches TR1 and TR2. The device isolation layer ST may be formed of or include at least one of insulating materials (e.g., silicon oxide). The device isolation layer ST may be recessed to expose upper portions of the first and second active patterns AP1 and AP2. For example, the upper portions of the first and second active patterns AP1 and AP2 may protrude vertically above the device isolation layer ST.

Figure 17:
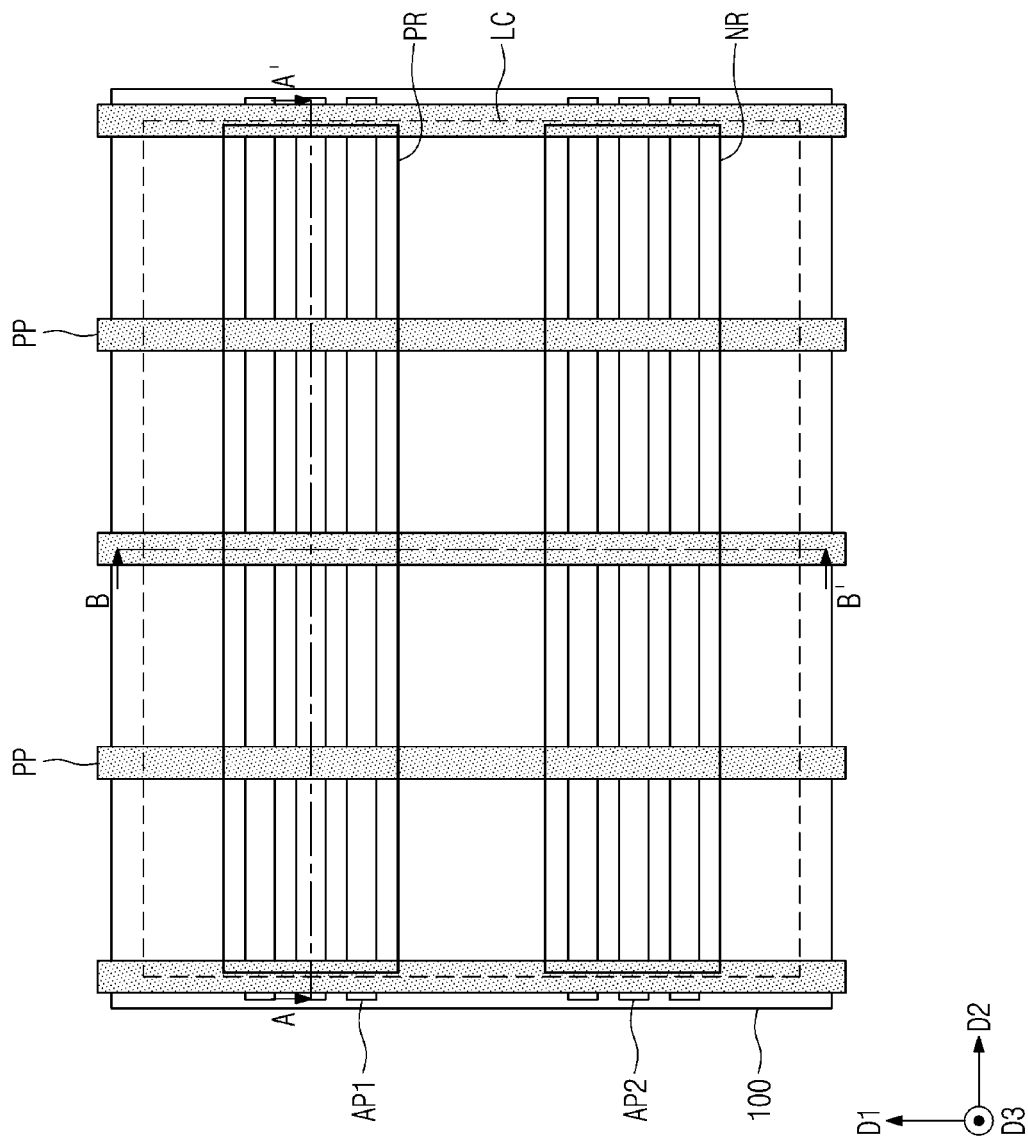
Figure 18A:
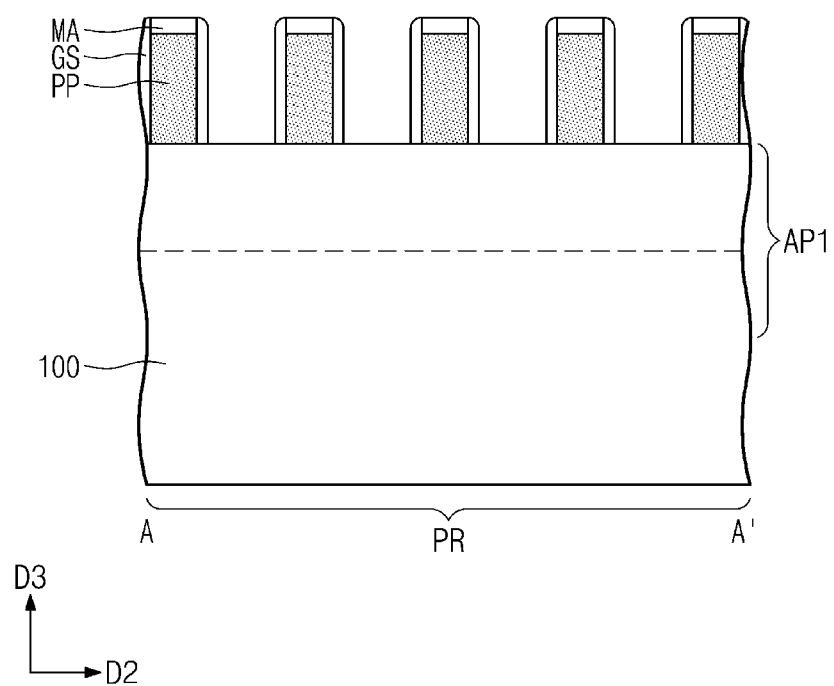
Figure 18B:
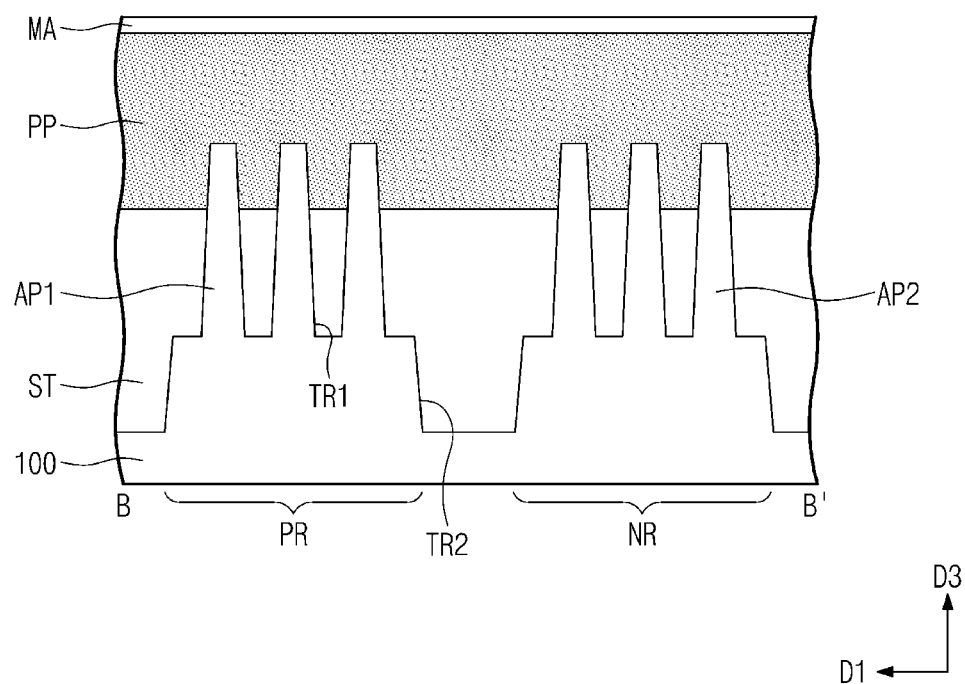
FIGS. 18B, 20B, and 22B are sectional views, which are respectively taken along lines B-B' of FIGS. 17, 19, and 21 according to example embodiments.
Figure 19:
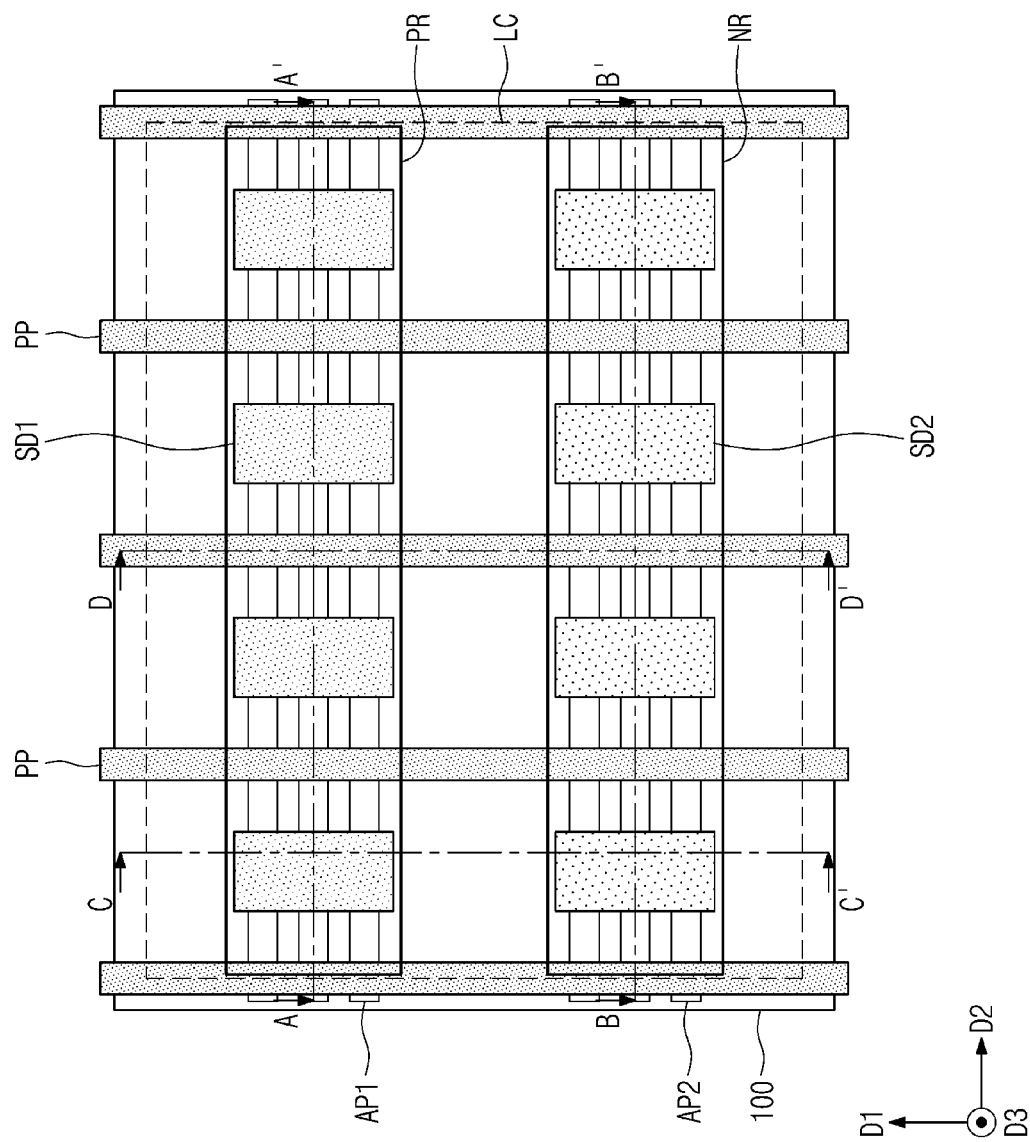

Referring to FIGS. 17, 18A, and 18B, sacrificial patterns PP may be formed to cross the first and second active patterns AP1 and AP2. The sacrificial patterns PP may be formed to have a line or bar shape extending in the first direction D1. As shown in FIG. 1, the sacrificial patterns PP may be formed to be spaced apart from each other at a constant pitch in the second direction D2.

In detail, the formation of the sacrificial patterns PP may include forming a sacrificial layer on the substrate 100, forming hard mask patterns MA on the sacrificial layer, and pattering the sacrificial layer using the hard mask patterns MA as an etch mask. The sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, and SiN. Alternatively, the gate spacer layer may include at least two layers, each of which is formed of at least one of SiCN, SiCON, and SiN, for example, the gate spacer layer may have a multi-layered structure.

Referring to FIGS. 19 and 20A to 20D, the first source/drain patterns SD1 may be formed in an upper portion of the first active pattern AP1. A pair of the first source/drain patterns SD1 may be formed at both sides of each of the sacrificial patterns PP.

In detail, first recesses RS1 may be formed by etching an upper portion of the first active pattern AP1 using the hard mask patterns MA and the gate spacers GS as an etch mask.

During the etching of the upper portion of the first active pattern AP1, the device isolation layer ST between the first active patterns AP1 may be recessed, as shown in FIG. 20C.

The first source/drain pattern SD1 may be formed by performing a selective epitaxial growth process using an inner side surface of the first recess RS1 of the first active pattern AP1 as a seed layer. As a result of the formation of the first source/drain patterns SD1, the first channel pattern CH1 may be defined between each pair of the first source/drain patterns SD1. As an example, the selective epitaxial growth process may include a chemical vapor deposition (CVD) process or a molecular beam epitaxy (MBE) process. The first source/drain patterns SD1 may be formed of or include a semiconductor material (e.g., SiGe) having a lattice constant greater than that of the substrate 100. Each of the first source/drain patterns SD1 may be a multi-layered structure including a plurality of semiconductor layers.

In an embodiment, the first source/drain patterns SD1 may be doped in an in-situ manner during a selective epitaxial growth process. In another embodiment, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed in an upper portion of the second active pattern AP2. A pair of the second source/drain patterns SD2 may be formed at both sides of each of the sacrificial patterns PP.

In detail, second recesses RS2 may be formed by etching an upper portion of the second active pattern AP2 using the hard mask patterns MA and the gate spacers GS as an etch mask. The second source/drain pattern SD2 may be formed by performing a selective epitaxial growth process using an inner side surface of the second recess RS2 of the second active pattern AP2 as a seed layer. As a result of the formation of the second source/drain patterns SD2, the second channel pattern CH2 may be defined between each pair of the second source/drain patterns SD2.

The second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. For example, the first source/drain patterns SD1 and the second source/drain patterns SD2 may not be formed at the same time.

Referring to FIGS. 21 and 22A to 22D, the first insulating layer 110 may be formed to cover the first and second source/drain patterns SD1 and SD2, the hard mask patterns MA, and the gate spacers GS. As an example, the first insulating layer 110 may include a silicon oxide layer.

The first insulating layer 110 may be planarized to expose top surfaces of the sacrificial patterns PP. The planarization of the first insulating layer 110 may be performed using an etch-back or chemical mechanical polishing (CMP) process. In an embodiment, the planarization process may be performed to remove all of the hard mask patterns MA. As a result, the first insulating layer 110 may have a top surface that is coplanar with the top surfaces of the sacrificial patterns PP and the top surfaces of the gate spacers GS.

The sacrificial patterns PP may be replaced with the gate electrodes GE, respectively. In detail, the sacrificial patterns PP exposed may be selectively removed. As a result of the removal of the sacrificial patterns PP, empty spaces may be formed. The gate insulating layer GI, the gate electrode GE, and the gate capping pattern GP may be formed in each of the empty spaces. The gate electrode GE may include the first metal pattern and the second metal pattern on the first metal pattern. The first metal pattern may be formed of a work function metal, which is used to adjust a threshold voltage of a transistor, and the second metal pattern may be formed of a metallic material having a low resistance.

The second insulating layer 120 may be formed on the first insulating layer 110. The second insulating layer 120 may include a silicon oxide layer. The active contacts AC may be formed to penetrate the second insulating layer 120 and the first insulating layer 110 and may be electrically connected to the first and second source/drain patterns SD1 and SD2. The gate contact GC may be formed to penetrate the second insulating layer 120 and the gate capping pattern GP and may be electrically connected to the gate electrode GE.

The pair of the division structures DB may be formed at both sides of the logic cell LC, which are opposite to each other in the second direction D2. The division structures DB may be formed to be overlapped with the gate electrodes GE in the second direction D2, which are respectively formed at both sides of the logic cell LC. For example, the formation of the division structures DB may include forming a hole to penetrate the first and second insulating layers 110 and 120 and the gate electrode GE and to extend into the first and second active patterns AP1 and AP2 and then filling the hole with an insulating layer.

Referring back to FIGS. 13 and 14A to 14D, the first interlayer insulating layer ILD1 may be formed on the second insulating layer 120. The first metal layer M1 may be formed in the first interlayer insulating layer ILD1. The formation of the first metal layer M1 may include forming the first and second power lines M1_PIL1 and M1_PIL2, the M1 interconnection lines M1_IL, and the vias VI. In an embodiment, the first and second power lines M1_PIL1 and M1_PIL2, the M1 interconnection lines M1_IL, and the vias VI may be formed by a single damascene process.

The etch stop layer ESL may be formed on the first metal layer M1. The second interlayer insulating layer ILD2 may be formed on the etch stop layer ESL. The second metal layer M2 may be formed in the second interlayer insulating layer ILD2. In an embodiment, the second metal layer M2 may be formed by the same method as that in the embodiment described with reference to FIGS. 1 to 6.

The third interlayer insulating layer ILD3 may be formed on the second metal layer M2. The third metal layer M3 may be formed in the third interlayer insulating layer ILD3. The formation of the third metal layer M3 may include forming the M3 interconnection lines M3_IL.

According to an embodiment of the inventive concept, a lithography process using extreme ultraviolet (EUV) light may be performed to form the interconnection lines in each of the first, second, and third metal layers M1, M2, and M3. In the present specification, the EUV light may have a wavelength ranging from 4 nm to 124 nm and, in particular, from 4 nm to 20 nm and may be, for example, an ultraviolet light having a wavelength of 13.5 nm. The EUV light may have an energy of 6.21 eV to 124 eV and, in particular, of 90 eV to 95 eV.

The lithography process using the EUV light may include performing an exposing process of irradiating a photoresist layer with the EUV light and performing a developing process. As an example, the photoresist layer may be an organic photoresist layer containing an organic polymer (e.g., polyhydroxystyrene). The organic photoresist layer may further include a photosensitive compound which can be reacted with the EUV light. The organic photoresist layer may further contain a material having high EUV absorptivity (e.g., organometallic materials, iodine-containing materials, or fluorine-containing materials). As another example, the photoresist layer may be an inorganic photoresist layer containing an inorganic material (e.g., tin oxide).

The photoresist layer may be formed to have a relatively small thickness. Photoresist patterns may be formed by developing the photoresist layer, which is exposed to the EUV light. When viewed in a plan view, the photoresist patterns may be formed to have a line shape extending in a specific direction, an island shape, a zigzag shape, a honeycomb shape, or a circular shape, but the inventive concept is not limited to these examples.

Mask patterns may be formed by patterning at least one mask layer, which is disposed below the photoresist patterns, using the photoresist patterns as an etch mask. Thereafter, trenches, which will be filled with desired patterns (e.g., the interconnection lines), may be formed on a wafer by patterning a target layer (e.g., the interlayer insulating layer ILD1, ILD2, or ILD3) using the mask patterns as an etch mask.

In a comparative example of the inventive concept, a multi-patterning technology (MPT) using two or more photomasks is required to form fine-pitch patterns on the wafer. By contrast, in the case where the EUV lithography process according to an embodiment of the inventive concept is performed, the interconnection lines may be formed to have a fine pitch, even when just one photomask is used.

For example, referring back to FIG. 14D, a pitch between the M1 interconnection lines M1_IL, which are realized by the EUV lithography process according to the present embodiment, may be less than or equal to 45 nm. For example, the EUV lithography process may be performed to form the interconnection lines precisely and finely, without a multi-patterning technology.

FIGS. 23A to 23D are sectional views, which are respectively taken along lines A-A', B-B', C-C', and D-D' of FIG. 13 to illustrate a semiconductor device according to an embodiment of the inventive concept. In the following description, an element previously described with reference to FIGS. 13 and 14A to 14D may be identified by the same reference number without repeating an overlapping description thereof.

Referring to FIGS. 13 and 23A to 23D, the substrate 100 including the first and second active regions PR and NR may be provided. The device isolation layer ST may be provided on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first active pattern AP1 may include the first channel patterns CH1, which are vertically stacked. The stacked first channel patterns CH1 may be spaced apart from each other in the third direction D3. The stacked first channel patterns CH1 may be vertically overlapped with each other. The second active pattern AP2 may include the second channel patterns CH2, which are vertically stacked. The stacked second channel patterns CH2 may be spaced apart from each other in the third direction D3. The stacked second channel patterns CH2 may be vertically overlapped with each other. The first and second channel patterns CH1 and CH2 may be formed of or include at least one of silicon (Si), germanium (Ge), and silicon-germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect the adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect the adjacent pair of the second source/drain patterns SD2 to each other.

The gate electrodes GE may be provided to cross the first and second channel patterns CH1 and CH2 and to extend in the first direction D1. The gate electrode GE may be vertically overlapped with the first and second channel patterns CH1 and CH2. A pair of the gate spacers GS may be disposed on opposite side surfaces of the gate electrode GE. The gate capping pattern GP may be provided on the gate electrode GE.

Figure 23A:
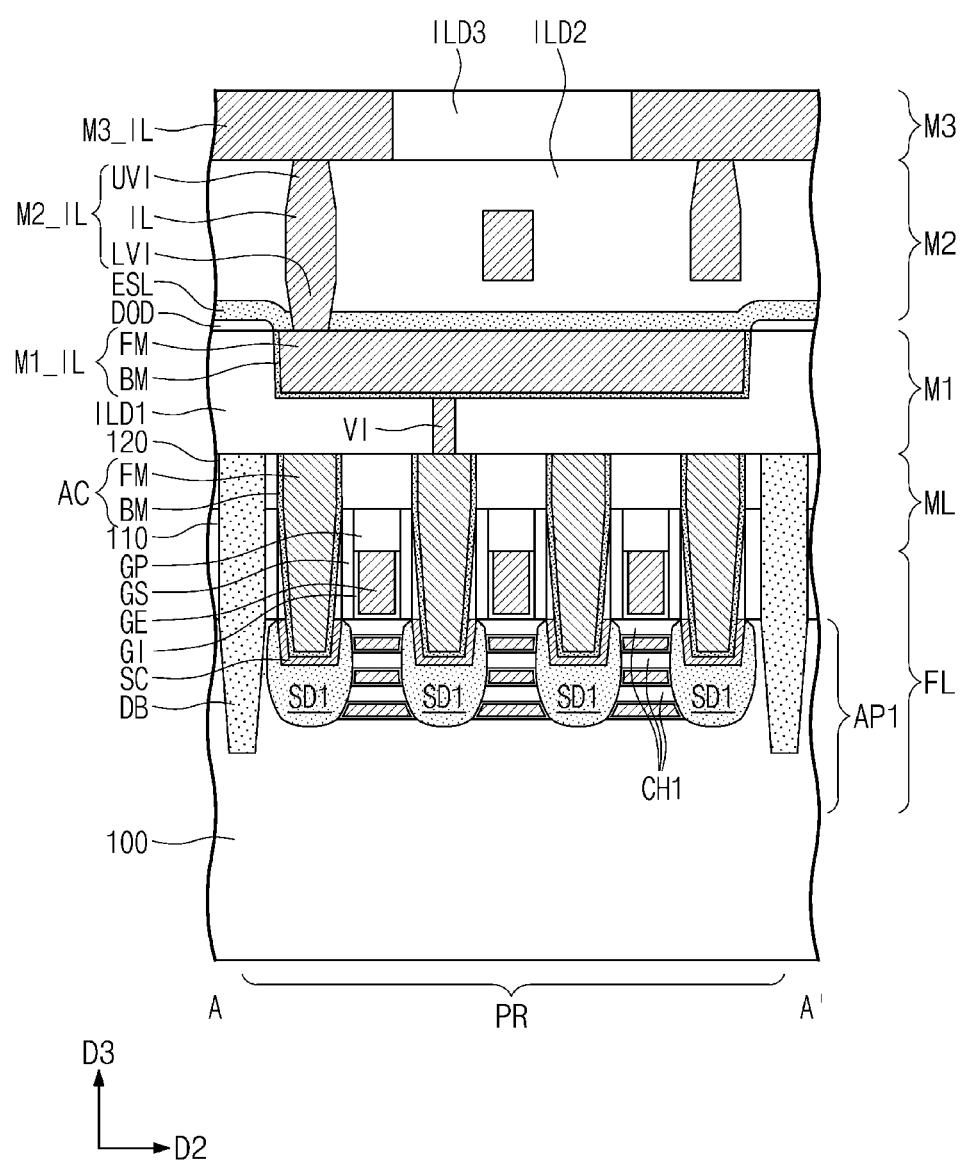
FIGS. 23A to 23D are sectional views, which are respectively taken along lines A-A', B-B', C-C', and D-D' of FIG. 13 to illustrate a semiconductor device according to an embodiment of the inventive concept.
Figure 23B:
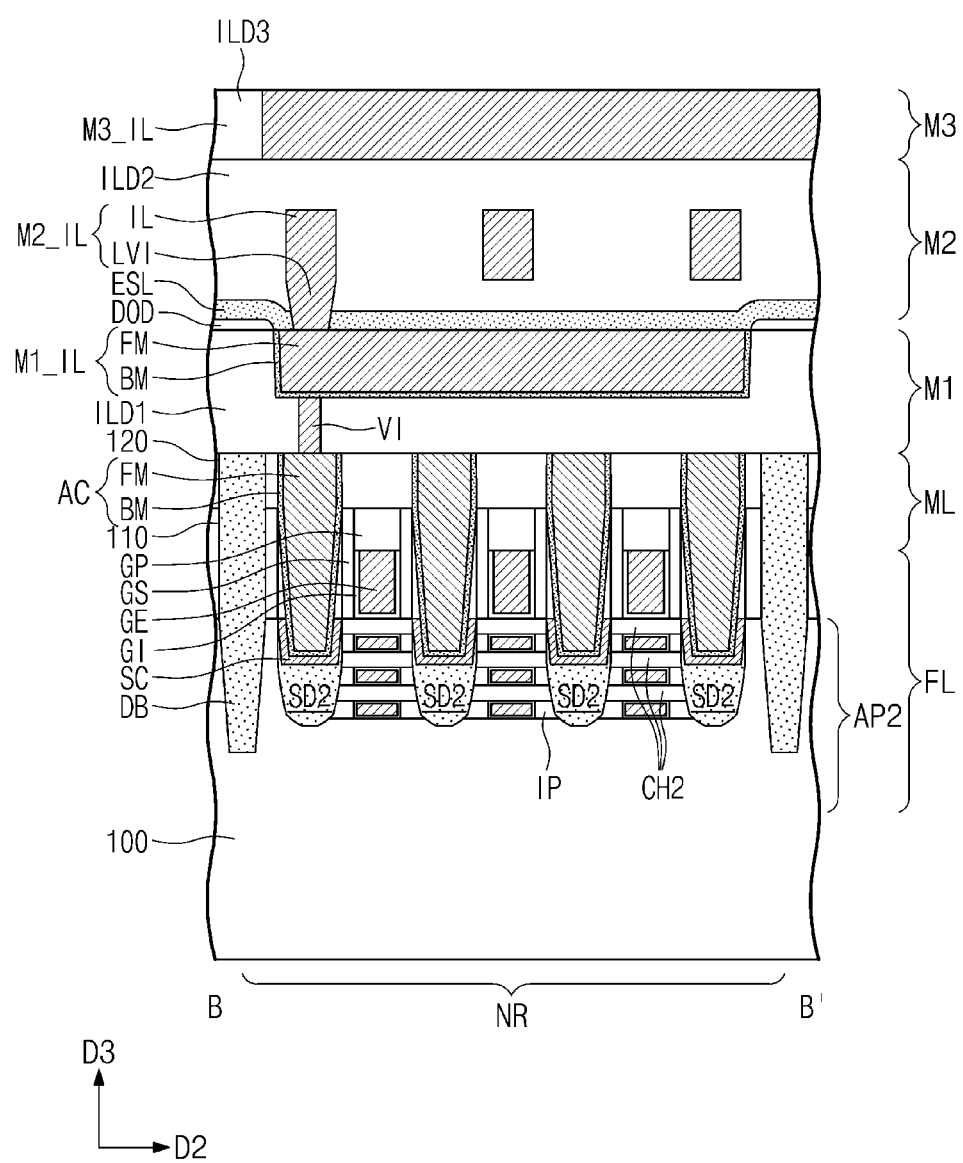
Figure 23C:
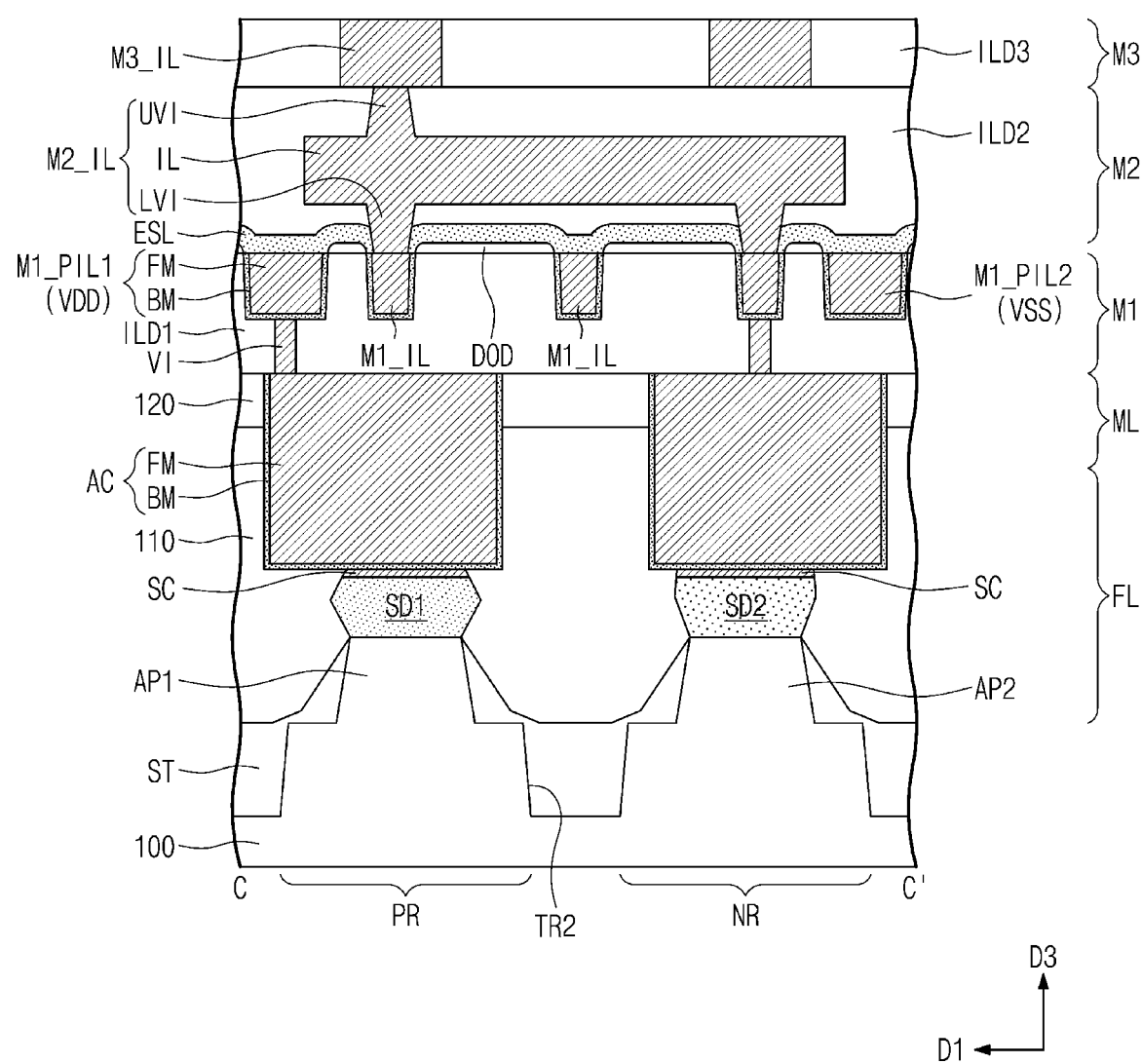
Figure 23D:
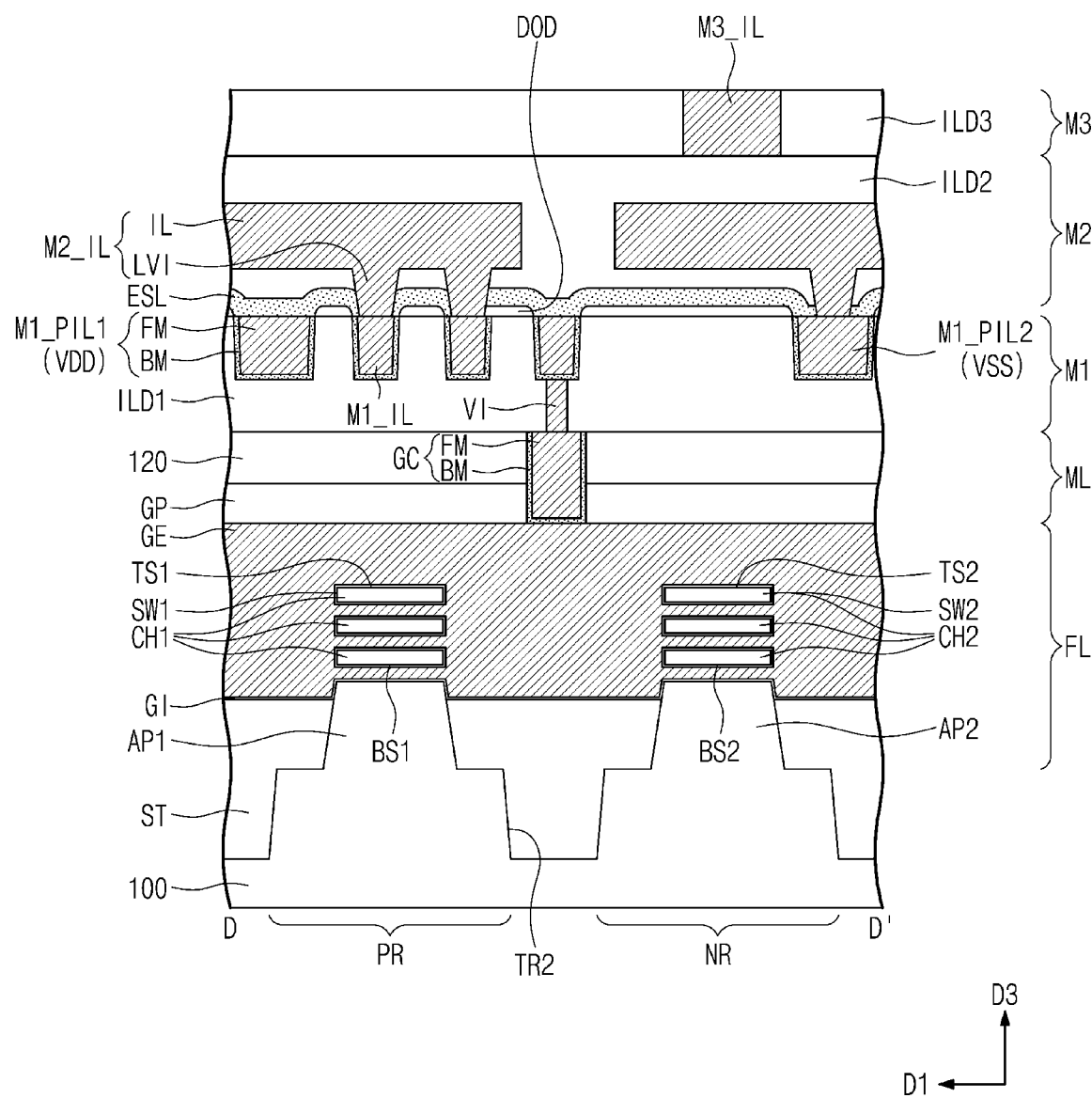

The gate electrode GE may be provided to surround each of the first and second channel patterns CH1 and CH2 (e.g., see FIG. 23D). The gate electrode GE may be provided on a first top surface TS1, at least one first side surface SW1, and a first bottom surface BS1 of the first channel pattern CH1. The gate electrode GE may be provided on a second top surface TS2, at least one second side surface SW2, and a second bottom surface BS2 of the second channel pattern CH2. For example, the gate electrode GE may be provided to face a top surface, a bottom surface and both side surfaces of each of the first and second channel patterns CH1 and CH2. The transistor according to the present embodiment may be a three-dimensional field effect transistor (e.g., multi-bridge channel FET (MBCFET) or gate-all-around FET (GAAFET)) in which the gate electrode GE is provided to three-dimensionally surround the channel pattern CH1 or CH2.

The gate insulating layer GI may be provided between each of the first and second channel patterns CH1 and CH2 and the gate electrode GE. The gate insulating layer GI may be provided to surround each of the first and second channel patterns CH1 and CH2.

On the second active region NR, an insulating pattern IP may be interposed between the gate insulating layer GI and the second source/drain pattern SD2. The gate electrode GE may be spaced apart from the second source/drain pattern SD2 by the gate insulating layer GI and the insulating pattern IP. In an embodiment, the insulating pattern IP may be omitted on the first active region PR.

The first insulating layer 110 and the second insulating layer 120 may be provided on the substrate 100. The active contacts AC may be provided to penetrate the first and second insulating layers 110 and 120 and may be connected to the first and second source/drain patterns SD1 and SD2, respectively. The gate contact GC may be provided to penetrate the second insulating layer 120 and the gate capping pattern GP and may be connected to the gate electrode GE.

The first metal layer M1, the second metal layer M2, and the third metal layer M3 may be sequentially stacked on the second insulating layer 120. The first to third metal layers M1, M2, and M3 may be provided to have substantially the same features as those in the embodiment previously described with reference to FIGS. 13 and 14A to 14D.

In a semiconductor device according to an embodiment of the inventive concept, all of a lower via, an interconnection line, and an upper via may be realized from a single conductive layer. Thus, it may be possible to reduce the number of etch stop layers and thereby to reduce a parasitic capacitance in a BEOL layer. According to an embodiment of the inventive concept, the interconnection line may be formed to have a high aspect ratio. Via and line portions of the interconnection line may be formed of or include different metallic materials whose electric resistances are chosen to be suitable for their functions. Thus, an electric resistance of the interconnection line may be reduced. As a result, it may be possible to realize a semiconductor device with improved electric characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
    a front-end-of-line (FEOL) layer, which includes a plurality of individual devices, on a substrate; and
    a first metal layer, a second metal layer, and a third metal layer sequentially stacked on the FEOL layer,
    wherein the second metal layer comprises an interlayer insulating layer and an interconnection line in the interlayer insulating layer,
    wherein the interconnection line comprises:
        a lower via portion electrically connected to the first metal layer;
        an upper via portion electrically connected to the third metal layer; and
        a line portion between the lower via portion and the upper via portion,
    wherein the interlayer insulating layer comprises a lower interlayer insulating layer and an upper interlayer insulating layer on the lower interlayer insulating layer,
    wherein a lower part of the interconnection line is buried in the lower interlayer insulating layer,
    wherein an upper part of the interconnection line is buried in the upper interlayer insulating layer,
    wherein a line width of the upper part gradually decreases in a vertical direction away from the substrate, and
    wherein a line width of the lower part gradually increases in the vertical direction away from the substrate,
    wherein the second metal layer further comprises an etch stop layer between the lower interlayer insulating layer and the first metal layer, and
    wherein the lower via portion is provided to penetrate the etch stop layer.

2. The semiconductor device of claim 1, wherein one of a first side surface of the upper part and a second side surface of the lower part has a positive slope, and
    wherein the other of the first and second side surfaces has a negative slope.

3. The semiconductor device of claim 2, wherein an angle between the first side surface and a top surface of the substrate is an obtuse angle greater than 90°, and
    wherein an angle between the second side surface and the top surface of the substrate is an acute angle less than 90°.

4. The semiconductor device of claim 1,
    wherein a bottom surface of the line portion is higher than a top surface of the etch stop layer.

5. The semiconductor device of claim 1, wherein the interconnection line is a first interconnection line, and the semiconductor device further comprises a second interconnection line; disposed adjacent to the first interconnection line,
    wherein a top surface of the line portion of the first interconnection line is located at a first height, and
    wherein a top surface of the line portion of the second interconnection line is located at a second height different from the first height.

6. The semiconductor device of claim 1, wherein the lower via portion, the line portion, and the upper via portion of the interconnection line are connected to each other to form a single object.

7. The semiconductor device of claim 1, wherein the lower via portion, the line portion and the upper via portion of the interconnection line comprise the same metallic material.

8. The semiconductor device of claim 1, wherein at least one of the lower and upper via portions comprises a metallic material different from the line portion.

9. The semiconductor device of claim 1, wherein the lower via portion comprises a first conductive layer,
    wherein the line portion comprises a second conductive layer,
    wherein the upper via portion comprises a third conductive layer,
    wherein the first to third conductive layers comprise different metallic materials from each other, and
    wherein a slope of a side surface of the upper via portion is different from a slope of a side surface of the line portion.

10. The semiconductor device of claim 1, wherein the lower part of the interconnection line is configured to be formed by a damascene process, and
    wherein the upper part of the interconnection line is configured to be formed by a metal etching process.

11. A semiconductor device, comprising:
    a front-end-of-line (FEOL) layer, which includes a plurality of individual devices, on a substrate; and
    a first metal layer, a second metal layer, and a third metal layer sequentially stacked on the FEOL layer,
    wherein the second metal layer comprises a lower interlayer insulating layer, an upper interlayer insulating layer, and an interconnection line extending in a first direction,
    wherein the interconnection line comprises a lower part and an upper part, which are buried in the lower and upper interlayer insulating layers, respectively,
    wherein the lower part comprises a lower via portion electrically connected to the first metal layer,
    wherein the upper part comprises an upper via portion electrically connected to the third metal layer, and
    wherein the lower and upper parts of the interconnection line are offset from each other in a second direction crossing the first direction,
    wherein the second metal layer further comprises an etch stop layer between the lower interlayer insulating layer and the first metal layer, and
    wherein the lower via portion is provided to penetrate the etch stop layer.

12. The semiconductor device of claim 11, wherein the upper part has a first center line defined to vertically pass through a center of the upper part,
    wherein the lower part has a second center line defined to vertically pass through a center of the lower part, and
    wherein the first center line and the second center line are offset from each other in the second direction.

13. The semiconductor device of claim 11, wherein the interconnection line comprises a recessed side surface between a first side surface of the upper part and a second side surface of the lower part,
    wherein the recessed side surface is lower than a top surface of the lower interlayer insulating layer, and wherein the upper interlayer insulating layer covers the recessed side surface.

14. The semiconductor device of claim 11, wherein the interconnection line comprises a stepwise side surface between a first side surface of the upper part and a second side surface of the lower part, and
wherein the stepwise side surface is defined at an interface between the lower interlayer insulating layer and the upper interlayer insulating layer.

15. The semiconductor device of claim 11, wherein one of a first side surface of the upper part and a second side surface of the lower part has a positive slope, and
wherein the other of the first and second side surfaces has a negative slope.

16. A semiconductor device, comprising:
a substrate including an active region;
a device isolation layer defining active patterns on the active region and covering a lower side surface of each of the active patterns;
source/drain patterns provided in upper portions of the active patterns;
a channel pattern interposed between each pair of the source/drain patterns;
a gate electrode extended in a first direction to cross the channel pattern;
a gate spacer provided at both sides of the gate electrode and extended in the first direction, along with the gate electrode;
a gate insulating layer interposed between the gate electrode and the channel pattern and between the gate electrode and the gate spacer;
a gate capping pattern provided on a top surface of the gate electrode and extended in the first direction, along with the gate electrode;
an active contact electrically connected to at least one of the source/drain patterns;
a gate contact provided to penetrate the gate capping pattern and electrically connected to the gate electrode; and
a first metal layer, a second metal layer, and a third metal layer sequentially stacked on the active contact and the gate contact,
wherein the first metal layer is electrically connected to the active contact and the gate contact,
wherein the second metal layer comprises an interlayer insulating layer and an interconnection line in the interlayer insulating layer,
wherein the interlayer insulating layer comprises a lower interlayer insulating layer and an upper interlayer insulating layer on the lower interlayer insulating layer,
wherein the interconnection line comprises:
a lower via portion electrically connected to the first metal layer;
an upper via portion electrically connected to the third metal layer; and
a line portion between the lower via portion and the upper via portion,
wherein one of a first side surface of the upper via portion and a second side surface of the lower via portion has a positive slope, and
wherein the other of the first and second side surfaces has a negative slope,
wherein the second metal layer further comprises an etch stop layer between the lower interlayer insulating layer and the first metal layer, and
wherein the lower via portion is provided to penetrate the etch stop layer.

17. The semiconductor device of claim 16, wherein an angle between the first side surface and a top surface of the substrate is an obtuse angle greater than 90°, and
wherein an angle between the second side surface and the top surface of the substrate is an acute angle less than 90°.

18. The semiconductor device of claim 16, wherein the second metal layer further comprises an etch stop layer between the interlayer insulating layer and the first metal layer,
wherein the lower via portion is provided to penetrate the etch stop layer and is connected to the first metal layer, and
wherein a bottom surface of the line portion is higher than a top surface of the etch stop layer.

19. The semiconductor device of claim 16, wherein the lower via portion, the line portion, and the upper via portion are connected to each other to form a single object.

20. The semiconductor device of claim 16, wherein at least one of the lower and upper via portions is aligned to an end portion of the line portion.

* * * * *